United States Patent
Sekiguchi et al.

(10) Patent No.: US 8,592,807 B2
(45) Date of Patent: Nov. 26, 2013

(54) PHOTOELECTRIC ELEMENT

(75) Inventors: Takashi Sekiguchi, Osaka (JP); Mitsuo Yaguchi, Osaka (JP); Takeyuki Yamaki, Nara (JP); Hiroyuki Nishide, Tokyo (JP); Kenichi Oyaizu, Tokyo (JP); Fumiaki Kato, Tokyo (JP); Michio Suzuka, Osaka (JP); Shingo Kambe, Osaka (JP); Satoko Kambe, legal representative, Osaka (JP)

(73) Assignees: Panasonic Corporation, Kodama-shi (JP); Waseda University, Tokyo (JP)

( * ) Notice: Subject to any disclaimer, the term of this patent is extended or adjusted under 35 U.S.C. 154(b) by 0 days.

(21) Appl. No.: 13/387,222

(22) PCT Filed: Jul. 29, 2010

(86) PCT No.: PCT/JP2010/062823
§ 371 (c)(1),
(2), (4) Date: Apr. 10, 2012

(87) PCT Pub. No.: WO2011/013760
PCT Pub. Date: Feb. 3, 2011

(65) Prior Publication Data
US 2012/0187387 A1 Jul. 26, 2012

(30) Foreign Application Priority Data

Jul. 31, 2009 (JP) ................... 2009-180175
Jul. 31, 2009 (JP) ................... 2009-180176
Jun. 16, 2010 (JP) ................... 2010-137687

(51) Int. Cl.
*H01L 51/44* (2006.01)
(52) U.S. Cl.
USPC ............... 257/40; 257/E51.012; 257/E51.018

(58) Field of Classification Search
USPC ............................. 257/40, E51.012, E51.018
See application file for complete search history.

(56) References Cited

U.S. PATENT DOCUMENTS

| 2003/0062080 A1 | 4/2003 | Satoh et al. |
| 2009/0084442 A1 | 4/2009 | Naito et al. |

FOREIGN PATENT DOCUMENTS

| JP | 2001-028276 A | 1/2001 |
| JP | 2003-100360 A | 4/2003 |
| JP | 2008-159334 A | 7/2008 |
| JP | 2009-054936 A | 3/2009 |
| JP | 2009-065216 A | 3/2009 |
| JP | 2009-088045 A | 4/2009 |

OTHER PUBLICATIONS

Hiroshi Imahori et al., "Bunshi taiyo denchi no tenbo [The outlook for molecular solar cells]," Kagaku Kogyo, Jul. 2001, p. 41 and English abstract thereof.
International Search Report dated Oct. 26, 2010, issue for PCT/JP2010/062823.

*Primary Examiner* — Long Pham
(74) *Attorney, Agent, or Firm* — Edwards Wildman Palmer LLP

(57) ABSTRACT

Disclosed is a photoelectric element having an excellent conversion efficiency and provided with a hole transporting layer that is endowed with excellent hole transporting properties and a sufficiently large reaction interface.
The photoelectric element of the invention has a pair of electrodes, an electron transporting layer and a hole transporting layer which are disposed between the electrodes, and an electrolyte solution. The hole transporting layer includes a first organic compound having a redox moiety capable of repeated oxidation and reduction. The electrolyte solution stabilizes a reduced state of the redox moiety. The organic compound and the electrolyte solution together form a first gel layer.

8 Claims, 2 Drawing Sheets

PHOTOELECTRIC ELEMENT

TECHNICAL FIELD

The invention relates to a photoelectric element which converts light to electricity, or converts electricity to light.

BACKGROUND ART

In recent years, photoelectric elements have been used in power generating devices which carry out photoelectric conversion, such as photoelectric cells and solar cells; light-emitting devices such as organic electroluminescent (EL) devices; optical display devices such as electrochromic display devices and electronic paper; and sensor elements which are sensitive to temperature, light or the like.

It is essential for the hole transporting layer in a photoelectric element to have high hole transporting properties. Moreover, the size of the surface area of the interface is important to this hole transporting layer. Here, "interface" refers to the interface between the hole transporting layer and a layer other than the hole transporting layer, at which interface holes are generated under the effects of energy from the exterior and which acts when holes are injected from the exterior. The hole transporting layer has hitherto been formed of a metal, organic semiconductor, inorganic semiconductor, conductive polymer, conductive carbon or the like.

For example, in photoelectric conversion elements, the hole transporting layer for transporting holes is formed of an organic material such as poly(3-hexylthiophene), triphenyl-diamine (monomer, polymer, etc.), polyaniline, polypyrrole, polythiophene or a phthalocyanine compound. The conversion efficiency of photoelectric conversion elements is rising on account of the hole transporting abilities of such organic materials (see Patent Documents 1 to 3).

Also, it has been reported that, in the formation of a hole transporting layer for a molecular solar cell, a structure obtained by chemical bonding between an electron-donating molecule (donor) and an electron accepting molecule (acceptor) forms as a thin film on a substrate (see Non-Patent Document 1).

However, in the hole transporting layers reported in the above literature, sufficient hole transporting properties and a sufficient size of the interface for the function as a hole transporting layer have not both been achieved at once. Hence, there currently exists a desire for a hole transporting layer which has better hole transporting properties and also has a sufficiently large interface.

Patent Document 1: Japanese Patent Application Laid-open No. 2009-088045
Patent Document 2: Japanese Patent Application Laid-open No. 2009-065216
Patent Document 3: Japanese Patent Application Laid-open No. 2009-054936
Non-Patent Document 1: H. Imabori and S. Fukuzumi: "*Bunshi taiyo denchi no tenbo* [The outlook for molecular solar cells]", *Kagaku Kogyo*, July 2001, p. 41

SUMMARY OF INVENTION

Technical Problem

In light of the above, the object of this invention is to provide a photoelectric element having an excellent conversion efficiency, which element is endowed with excellent hole transporting properties and a sufficiently large reaction interface.

Solution to Problem

The photoelectric element according to the present invention includes a pair of electrodes, an electron transporting layer and a hole transporting layer which are disposed between the electrodes, and an electrolyte solution. The hole transporting layer includes a first organic compound having a redox moiety capable of repeated oxidation and reduction, the electrolyte solution stabilizes the reduced state of the redox moiety, and the organic compound and the electrolyte solution together form a first gel layer.

The photoelectric element of the invention may further include a sensitizing dye which is present in the first gel layer.

In the photoelectric element of the invention, the hole transporting layer may include a nitroxide radical polymer.

In the photoelectric element of the invention, the electron transporting layer may include at least one compound selected from the group consisting of viologen derivatives, phenoxyl derivatives and quinone derivatives.

In the photoelectric element of the invention, the open circuit voltage A (V) after 5 minutes of irradiation with 200 lux light and the open circuit voltage B (V) when 5 minutes have elapsed after shielding of the light following irradiation may satisfy the following condition:

$(B/A) \times 100 \geq 10$.

In the photoelectric element of the invention, the electron transporting layer may further include a second organic compound having a redox moiety capable of repeated oxidation and reduction, the second organic compound and the electrolyte solution may together form a second gel layer, and the electron transporting layer may have a higher redox potential than the hole transporting layer.

The photoelectric element of the invention may further include a sensitizing dye which carries out an electron transfer reaction with either or both of the electron transporting layer and the hole transporting layer.

The invention both increases the hole transporting properties of the hole transporting layer and also increases the size of the reaction interface, thereby improving the conversion efficiency of the photoelectric element.

Advantageous Effects of Invention

According to the present invention, the hole transport property of the hole transport layer improves while the reaction interface becomes wide, improving the conversion efficiency of the photoelectric element.

DESCRIPTION OF EMBODIMENTS

Figure 1:
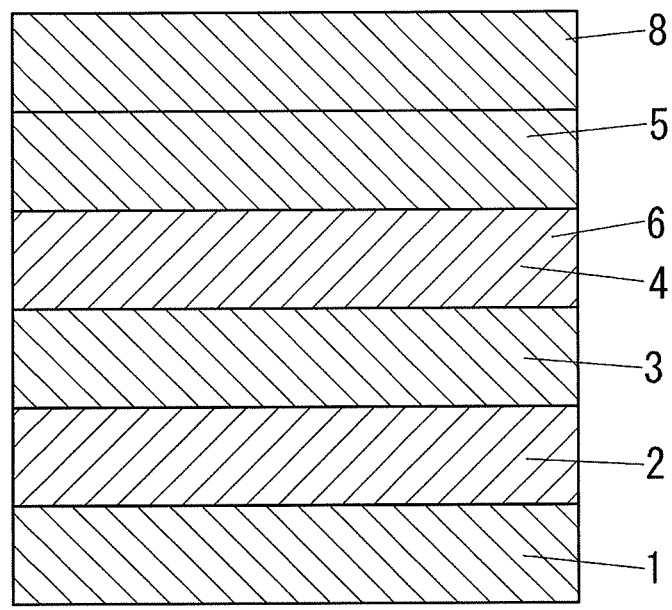
FIG. 1 is a schematic cross-sectional diagram showing one embodiment of the invention.

In a first embodiment of the invention, a photoelectric element is formed of an electron transporting layer 3 and a hole transporting layer 4 which are disposed between a pair of electrodes 2 and 5. The hole transporting layer 4 includes an organic compound having a redox moiety which is capable of repeated oxidation and reduction. The organic compound is with an electrolyte solution that stabilizes the oxidized state of the redox moiety to form a gel layer 6. A sensitizing dye is present in the gel layer 6.

In this embodiment, the organic compound of the hole transporting layer 4 and the electrolyte solution together form the gel layer 6, thus making the reaction interface of the organic compound larger and increasing the conversion efficiency.

Moreover, in this embodiment, in addition to the organic compound of the hole transporting layer 4 and the electrolyte solution together forming the gel layer 6, because a sensitizing dye is present in the gel layer 6, the organic compound reaction interface is even larger, increasing the conversion efficiency, and the hole transfer efficiency from the sensitizing dye to the organic compound of the hole transporting layer 4 increases, resulting in a higher hole transporting efficiency.

In this embodiment, it is preferable for the hole transporting layer 4 to include a nitroxide radical polymer. In the nitroxide radical polymer, the nitroxide radical site exhibits a hole transporting function and also has stability in the oxidized state. Moreover, because the nitroxide radical polymer has a polymeric structure, whole of the layer exhibits a high hole transporting function.

Also, in this embodiment, the electron transporting layer 3 preferably includes at least one compound selected from the group consisting of viologen derivatives, phenoxyl derivatives, imide derivatives and quinone derivatives. In this case, the electron transporting layer 3 has the stability of an organic compound and moreover exhibits high electron transporting properties, thus manifesting effective functions as an electron transporting layer 3.

In the photoelectric element according to this embodiment, the open circuit voltage A (V) after 5 minutes of irradiation with 200 lux light and the open circuit voltage B (V) when 5 minutes have elapsed after shielding of the light following irradiation preferably satisfy the following relationship:

$$(B/A) \times 100 \geq 10.$$

The photoelectric element according to this embodiment may be constructed as follows.

The photoelectric element is formed of an electron transporting layer 3 and a hole transporting layer 4 which are disposed between a pair of electrodes 2 and 5. The electron transporting layer 3 is formed so as to include an organic compound having a redox moiety capable of repeated oxidation and reduction. The organic compound is with an electrolyte solution that stabilizes the redox state of the redox moiety to form a gel layer 6. The hole transporting layer 4 is formed so as to include an organic compound having a redox moiety capable of repeated oxidation and reduction. The organic compound is with an electrolyte solution that stabilizes the redox state of the redox moiety to form a gel layer 7. The electron transporting layer 3 has a higher redox potential than the electron transporting layer 4.

The photoelectric element of the invention may also include a sensitizing dye which carries out an electron transfer reaction with either or both of the electron transporting layer 3 and the hole transporting layer 4.

In this way, by forming the electron transporting layer 3 and the hole transporting layer 4 as gel layers 6 and 7, it is possible to provide a photoelectric element which is free of the problem of electrolyte leakage. Moreover, by forming the electron transporting layer 3 and the hole transporting layer 4 as gel layers 6 and 7, and by also having either or both of the electron transporting layer 3 and the hole transporting layer 4 interact with a sensitizing dye, it is possible to provide a photoelectric element which has a sufficiently large reaction interface and an excellent conversion efficiency. In this way, both photoelectric elements and dye-sensitized solar cells which have a high output and are free of fluid leakage can be provided.

This embodiment is described more fully below.

As shown in FIG. 1, in the photoelectric element, the electron transporting layer 3 and the hole transporting layer 4 are formed between the pair of electrodes 2 and 5. That is the photoelectric element has a first electrode 2, a second electrode 5, and an electron transporting layer 3 and a hole transporting layer 4 which are both disposed between the first electrode 2 and the second electrode 5.

Base materials 1 and 8 are provided outside of these respective electrodes 2 and 5. That is, a first base material 1 is provided over the first electrode 2, and a second base material 8 is provided over the second electrode 5.

The hole transporting layer 4 is formed of an organic compound (first organic compound) which has a redox moiety. This first organic compound is swollen with an electrolyte solution to form a gel layer 6 (first gel layer 6). That is, the first organic compound having a redox moiety and the electrolyte solution together make up the first gel layer 6, and the hole transporting layer 4 is composed of the first organic compound within the first gel layer 6. A sensitizing dye is present in the first gel layer 6.

In this embodiment, the photoelectric element includes a sensitizing dye, although the photoelectric element need not include a sensitizing dye.

The first electrode 2 is electrically connected to the electron transporting layer 3. The first electrode 2 carries out the function of extracting electrons from the electron transporting layer 3 to the exterior, or injecting electrons into the electron transporting layer 3. The first electrode 2 may also have the function of holding the electron transporting layer 3. The second electrode 5 is electrically connected to the hole transporting layer 4. The second electrode 5 carries out the function of extracting electrons from the hole transporting layer 4 to the exterior, or injecting holes into the hole transporting layer 4. "Exterior" refers to a power supply circuit, a secondary cell, a capacitor or the like which is electrically connected to the photoelectric element.

The first electrode 2 may be formed of a single film of an electrically conductive material such as a metal. In the present embodiment, a layer of conductive material is placed on the insulating first base material 1 of glass, film or the like so as to form the first electrode 2 on the first base material 1. Preferred examples of the conductive material include metals such as platinum, gold, silver, copper, aluminum, rhodium and indium; carbon; conductive metal oxides such as indium-tin oxide, antimony-doped tin oxide and fluorine-doped tin oxide; composites of the above metals or compounds; and materials obtained by coating the above metals or compounds with silicon oxide, tin oxide, titanium oxide, zirconium oxide, aluminum oxide or the like. The lower the surface resistance of the first electrode 2 the better; specifically, the surface resistance is preferably not more than 200Ω/□, and more preferably not more than 50Ω/□. The lower limit of this surface resistance is not subject to any particular limitation, but is generally 0.1Ω/□.

The second electrode 5 also may be formed from a single film of an electrically conductive material such as a metal, although in this embodiment, a layer of conductive material is placed on the insulating second base material 8 of glass, film or the like so as to form the second electrode 5 on the second base material 8. The electrode material (conductive material) used to form the second electrode 5 will vary with the type of element to be fabricated, although illustrative examples include metals such as platinum, gold, silver, copper, aluminum, rhodium and indium; carbon materials such as graphite, carbon nanotubes and platinum-supporting carbon; conductive metal oxides such as indium-tin oxide, antimony-doped tin oxide and fluorine-doped tin oxide; composites of the above metals or compounds; materials obtained by coating the above metals or compounds with silicon oxide, tin oxide, titanium oxide, zirconium oxide, aluminum oxide or the like; and conductive polymers such as polyethylene dioxythiophene, polypyrrole and polyaniline.

In cases where a first electrode 2 or a second electrode 5 composed of a transparent conductive oxide layer made of indium oxide, tin oxide, zinc oxide or the like is formed on the first base material 1 or the second base material 8, the first electrode 2 or the second electrode 5 may be formed by a vacuum process such as sputtering or vapor deposition, or by a wet process such as spin coating, spraying, screen printing, on a light-transmitting first base material 1 or second base material 8 composed of glass, resin or the like.

In cases where the first electrode 2 is formed on the base material 1 or the second electrode 5 is formed on the base material 8, when light must pass through the first base material 1 or the second base material 8, as in cases where the photoelectric element is a power generating device, a light-emitting device or an optical sensor, it is preferable for the first base material 1 or the second base material 8 to have a high light transmittance. In such cases, the first base material 1 or the second base material 8 has a light transmittance at a wavelength of 500 nm of preferably at least 50%, and more preferably at least 80%. The thicknesses of the first electrode 2 and the second electrode 5 are preferably in a range of from 0.1 to 10 μm. Within this range, the first electrode 2 and the second electrode 5 are formed to a uniform thickness and a decrease in the ability of light to pass through the first electrode 2 and the second electrode 5 is suppressed, enabling sufficient light to reach the electron transporting layer 3 or the hole transporting layer 4 after passing through the first electrode 2 or the second electrode 5.

The hole transporting layer 4 refers a layer which, when the photoelectric element is in a light-irradiated environment, has the function of accepting holes from the sensitizing dye and transporting the holes to an electrode, and which, for example, contains redox moieties having a redox potential with respect to a silver/silver chloride reference electrode which is lower than +100 mV.

The organic compound (first organic compound) making up the hole transporting layer 4 has, as one portion of the molecule, redox moieties capable of repeated oxidation and reduction, and also has, as another portion thereof, sites which is swollen with an electrolyte solution to form a gel (gel sites). The redox moieties are chemically bonded to the gel sites. No particular limitation is imposed on the relative positions of the redox moieties and the gel sites within molecules of the first organic compound. For example, in cases where the bone, e.g., the main chain, of the molecule is formed by the gel sites, the redox moieties are bonded to the main chain as side chains. Alternatively, the molecules of the first organic compound may have a structure in which the molecular bone forming the gel sites and the molecular bone forming the redox moieties are bonded to each other. When the redox moieties and the gel sites are present in the same molecule of the first organic compound in this way, the redox moieties are held by the first gel layer 6 at a position where holes are easily transported.

The explanation provided here of the first gel layer composed of the first organic compound and the electrolyte solution similarly applies to the subsequently described second gel layer 7 composed a second organic compound and the electrolyte solution.

Here, "redox" (oxidation-reduction reaction) refers to the giving and receiving (transfer) of electrons by ions, atoms or molecules, and "redox moiety" refers to a site which is capable of stably transferring electrons by redox reactions.

"Gel layer" refers to a layer which is formed by the swelling of a redox moiety-containing organic compound with electrolyte solution. That is, in the gel state, the organic compound assumes a three-dimensional network structure; the state in which spaces in this network are filled with liquid is called a gel layer.

"Redox moiety capable of repeated oxidation and reduction" denotes a site which reversibly assumes an oxidized form and a reduced form in redox reactions. The redox moiety is preferably a redox system-type component in which the oxidized form and the reduced form have the same charge.

One physical index which exerts a large influence on the reaction interface in the first gel layer 6 and the subsequently described second gel layer 7 is the degree of swelling. The degree of swelling referred to here is expressed as follows:

$$\text{Degree of Swelling (\%)} = [(\text{weight of gel})/(\text{weight of dried form of gel})] \times 100.$$

Here, the "dried form of gel" refers to what is obtained by drying the first gel layer 6 or the second gel layer 7. "Drying the first gel layer 6 or the second gel layer 7" refers to removing the solution, and in particular removing the solvent, included within the first gel layer 6 or the second gel layer 7. Examples of the method of drying the first gel layer 6 or the second gel layer 7 include methods of removing the solution or solvent from the first gel layer 6 or the second gel layer 7 in a heated and evacuated environment, and methods of removing the solution or solvent present in the first gel layer 6 or the second gel layer 7 with another solvent. When the solution or solvent present in the first gel layer 6 or the second gel layer 7 is removed with another solvent, selecting a solvent which has a high affinity with the solution or solvent and which is easily removed in a heated and evacuated environment makes it possible to effectively remove the solution or solvent present in the first gel layer 6 or the second gel layer 7.

The degree of swelling by the first gel layer 6 is preferably from 110 to 3,000%, and more preferably from 150 to 500%. At a degree of swelling of at least 110%, and especially at least 150%, the amount of electrolyte ingredients in the gel layer 6 sufficiently increases, and the degree of stabilization of the redox moiety becomes larger. Also, at a degree of swelling of not more than 3,000%, and especially not more than 500%, the density of the redox moieties in the first gel layer 6 becomes sufficiently large and the hole transporting layer 4 exhibits an excellent hole transporting ability, further enhancing the properties of the photoelectric element.

The first organic compound having redox moieties and gel sites may be in either a low-molecular-weight form or in a high-molecular-weight form. In cases where the first organic compound is in a low-molecular-weight form, an organic compound which forms a "low-molecular-weight gel" via hydrogen bonding and the like may be used as the first organic compound. In cases where the first organic compound is in a high-molecular-weight form, it is desirable for the first organic compound to be an organic compound having a number-average molecular weight of at least 1,000 because gelation will be capable of manifesting spontaneously. No particular upper limit is imposed on the molecular weight of the first organic compound when in a high-molecular-weight form, although this is preferably not more than 1,000,000. The gel state of the first gel layer 6 has an external appearance which is preferably like that of konjac jelly or an ion-exchange membrane, but is not subject to any particular limitation.

The redox moiety refers to a site which reversibly assumes an oxidized form and a reduced form in redox reactions. The redox moiety is preferably a redox system-type component in which the oxidized form and the reduced form have the same charge.

The first organic compound which includes the above-described redox moieties and gel sites on a single molecule has the following general formula:

$$(X_i)_{nj} \cdot Y_k.$$

$(X_i)_n$ and $(X_i)_{nj}$ represent gel sites, and $X_i$ represents a monomer of the compound which forms the gel sites. The gel sites may be composed of the polymer bone. The degree of polymerization n of the monomer is preferably in a range of n=1 to 100,000. Y represents the redox moieties which are bonded to X. The letters j and k are respectively any integer representing the number of occurrences of $(X_i)_n$ and Y included in a single molecule, and are each preferably in a range of from 1 to 100,000. The redox moieties Y may be bonded at any site on the polymer bone making up the gel sites $(X_j)_n$ and $(X_i)_{nj}$. The redox moieties Y may include different types of materials (atomic groups), in which case, from the standpoint of the electron exchange reactions, materials (atomic groups) having close redox potentials are preferred.

The first organic compound which has redox moieties and gel sites on one molecule and makes up the hole transporting layer 4 is exemplified by chemical species having an unpaired electron; that is, compounds having a radical (stable radical compound). Radical compounds having a nitroxide (NO.) on the molecule are preferred as the stable radical compound. The molecular weight (number-average molecular weight) of the stable radical compound is preferably at least 1,000. In this case, because the stable radical compound is a solid or close to a solid at standard temperature, it does not readily vaporize, increasing the stability of the element.

This stable radical compound is described here more fully. The stable radical compound is a compound which forms a radical compound in the course of at least either an electrochemical oxidation reaction or an electrochemical reduction reaction. The type of stable radical compound is not subject to any particular limitation, although a stable radical compound is preferred. A stable radical compound which is an organic compound having structural units of one or both of Formula 1 and Formula 2 below is preferred.

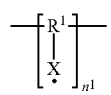

Formula 1

In Formula 1, the substituent $R^1$ is a substituted or unsubstituted $C_{2-30}$ alkylene group, $C_{2-30}$ alkenylene group, or $C_{4-30}$ arylene group; X is preferably a nitroxide radical or, for example, an oxy radical, sulfur radical, hydrazyl radical, carbon radical or boron radical; and $n^1$ is an integer of 2 or more.

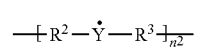

Formula 2

In Formula 2, the substituents $R^2$ and $R^3$ are each independently a substituted or unsubstituted $C_{2-30}$ alkylene group, $C_{2-30}$ alkenylene group or $C_{4-30}$ arylene group; Y is a nitroxide radical, sulfur radical, hydrazyl radical or carbon radical; and $n^2$ is an integer of 2 or more.

The stable radical compounds represented by Formula 1 and Formula 2 are exemplified by oxy radical compounds, nitroxide radical compounds, carbon radical compounds, nitrogen radical compounds, boron radical compounds and sulfur radical compounds.

Illustrative examples of oxy radical compounds include the aryloxy radical compounds of Formula 3 and Formula 4 below, and the semiquinone radical compounds of Formula 5 below.

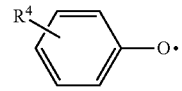

Formula 3

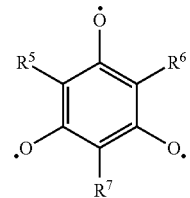

Formula 4

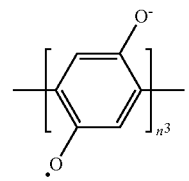

Formula 5

In Formula 3 and Formula 4, the substituents $R^4$ to $R^7$ are each independently a hydrogen atom, a substituted or unsubstituted aliphatic or aromatic $C_{1-30}$ hydrocarbon group, a halogen group, a hydroxyl group, a nitro group, a nitroxo group, a cyano group, an alkoxy group, an aryloxy group or an acyl group. In Formula 5, $n^3$ is an integer of 2 or more.

Illustrative examples of nitroxide radical compounds include the stable radical compounds having a peridinoxy ring shown in Formula 6 below, the stable radical compound having a pyrrolidinoxy ring shown in Formula 7, the stable radical compounds having a pyrrolinoxy ring shown in Formula 8, and the stable radical compounds having a nitronyl nitroxide structure shown in Formula 9.

Formula 6

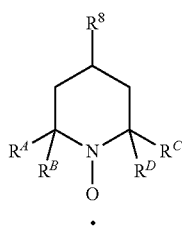

Formula 7

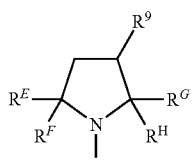

Formula 8

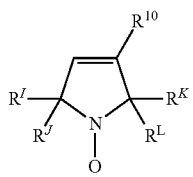

Formula 9

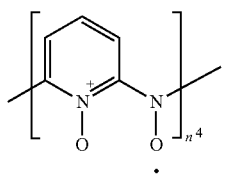

In Formula 6 to Formula 8, $R^8$ to $R^{10}$ and $R^A$ to $R^L$ are each independently a hydrogen atom, a substituted or unsubstituted aliphatic or aromatic $C_{1-30}$ hydrocarbon group, a halogen group, a hydroxyl group, a nitro group, a nitroso group, a cyano group, an alkoxy group, an aryloxy group or an acyl group. In Formula 9, $n^4$ is an integer of 2 or more.

Illustrative examples of the nitroxyl radical compounds include the radical compounds having a trivalent hydrazyl group shown in Formula 10 below, the radical compounds having a trivalent verdazyl group shown in Formula 11, and the radical compounds having an aminotriazine structure shown in Formula 12.

Formula 10

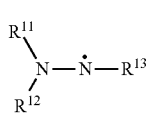

Formula 11

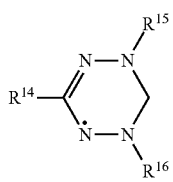

Formula 12

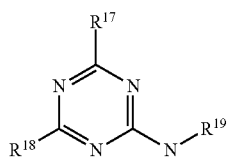

In Formula 10 to Formula 12, $R^{11}$ to $R^{19}$ are each independently a hydrogen atom, a substituted or unsubstituted aliphatic or aromatic $C_{1-30}$ hydrocarbon group, a halogen group, a hydroxyl group, a nitro group, a nitroso group, a cyano group, an alkoxy group, an aryloxy group or an acyl group.

The organic high-molecular-weight compounds shown in Formula 1 to Formula 12 above have an excellent stability, as a result of which they can be stably used in photoelectric conversion elements and power storage devices. Hence, when the organic high-molecular-weight compounds of Formula 1 to Formula 12 are used, photoelectric elements of excellent stability and also having an excellent response speed can easily be obtained.

It is preferable for stable radicals which attain a solid state at room temperature to be used. In such cases, contact between the radical compound and the electron transporting layer 3 is stably maintained, and side reactions with other chemical species and conversion or deterioration due to melting and diffusion are suppressed. As a result, the photoelectric element has an excellent stability.

Moreover, it is preferable to use a polymer containing a chemical species having an unpaired electron; that is, a polymer compound having a free radical. The use of a nitroxide radical polymer compound having a nitroxide radical (NO.) on the molecule is especially preferred.

Preferred examples of organic compounds in a high-molecular-weight form include the compounds (nitroxide radical polymers) of Formula 13 to Formula 16 below.

Here, Formula 13 represents a poly(TEMPO-substituted glycidyl ether) (PTGE), Formula 14 represents a poly(TEMPO-substituted norbornene) (PTNB), Formula 15 represents a poly(TEMPO-substituted acrylamide) (PTAm), and Formula 16 represents a poly(PROXYL-substituted glycidyl ether) (PPGE).

Formula 13

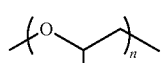
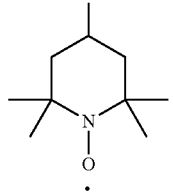

Formula 14

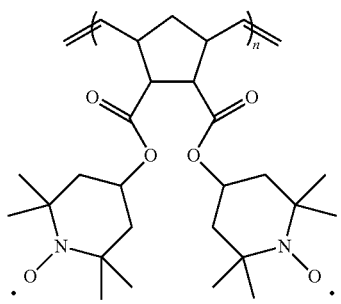

Formula 15

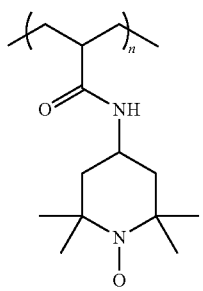

Formula 16

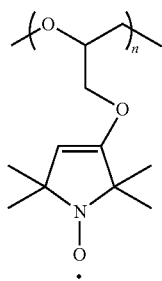

In Formula 13 to Formula 16, the letter n represents the degree of polymerization of the monomer, and is preferably in a range of from 1 to 100,000.

The above-described first organic compound having redox moieties and polymer bone is swollen with electrolyte solution which presents within the bone to form the first gel layer 6. Because electrolyte solution is included in the hole transporting layer 4, the ionic state that forms due to redox reactions at the redox moieties is compensated by counterions in the electrolyte solution, stabilizing the redox moieties.

The electrolyte solution need only contain an electrolyte and a solvent. The electrolyte is exemplified by a supporting salt and a redox system-type component having an oxidized form and a reduced form, and may be either one of these or both. Illustrative examples of the supporting salt (supporting electrolyte) include ammonium salts such as tetrabutylammonium perchlorate, tetraethylammonium hexafluorophosphate, imidazolium salts and pyridinium salts; and alkali metal salts such as lithium perchlorate and potassium tetrafluoroborate. Here, "redox system-type component" refers to a substance which, in a redox reaction, is reversibly present in an oxidized form and a reduced form. Illustrative, non-limiting, examples of such redox system-type components include chlorine compound—chlorine, iodine compound—iodine, bromine compound—bromine, thallium (III) ion—thallium (I) ion, mercury (II) ion—mercury (I) ion, ruthenium (III) ion—ruthenium (II) ion, copper (II) ion—copper (I) ion, iron (III) ion—iron (II) ion, nickel (II) ion—nickel (III) ion, vanadium (III) ion—vanadium (II) ion, manganate ion—permanganate ion.

The solvent in the electrolyte solution is exemplified by solvents containing at least one from among water, organic solvents and ionic liquids.

By using water or an organic solvent as the solvent in the electrolyte solution, the reduced state of the redox moieties in the first organic compound is stabilized, as a result of which holes are more stably transported. Either an aqueous solvent or an organic solvent may be used as the solvent, although organic solvents having an excellent ionic conductivity are preferred for better stabilizing the redox moieties. Illustrative examples of such organic solvents having an excellent ionic conductivity include carbonate compounds such as dimethyl carbonate, diethyl carbonate, methyl ethyl carbonate, ethylene carbonate and propylene carbonate; ester compounds such as methyl acetate, methyl propionate and γ-butyrolactone; ether compounds such as diethyl ether, 1,2-dimethoxyethane, 1,3-dioxosilane, tetrahydrofuran and 2-methyltetrahydrofuran; heterocyclic compounds such as 3-methyl-2-oxazolidinone and 2-methylpyrrolidone; nitrile compounds such as acetonitrile, methoxyacetonitrile and propionitrile; and aprotic polar compounds such as sulfolane, dimethylsulfoxide and dimethylformamide. These solvents may be used singly or in combinations of two or more thereof. Particularly in cases where the photoelectric element is to be formed as a photoelectric conversion element, from the standpoint of increasing the solar cell output properties, it is preferable for the solvent to be a carbonate compound such as ethylene carbonate or propylene carbonate; a heterocyclic compound such as γ-butyrolactone, 3-methyl-2-oxazolidinone or 2-methylpyrrolidone; or a nitrile compound such as acetonitrile, methoxyacetonitrile, propionitrile, 3-methoxypropionitrile or valeronitrile.

When an ionic liquid is used as the solvent of the electrolyte solution, the redox moiety stabilizing action is particularly enhanced. Moreover, because ionic liquids lack volatility and have a high non-flammability, the stability is excellent. Any known ionic liquid may be used here as the ionic liquid. Illustrative examples include imidazolium-based (e.g., 1-ethyl-3-methylimidazolium tetracyanoborate), pyridine-based, alicyclic amine-based, aliphatic amine-based, and azonium amine-based ionic liquids; and the ionic liquids mentioned in European Patent Specification No. 718288, WO95/18456, *Denki Kagaku* 65, No. 11, 923 (1997), *J. Electrochem. Soc.* 143, No. 10, 3099 (1996), and *Inorg. Chem.* 35, 1168 (1996).

The hole transporting layer 4 is formed by providing, on the surface of the first electrode 2, the above-described first gel layer 6 composed of a first organic compound having redox moieties and an electrolyte solution.

To maintain good electron transporting properties, the thickness of the hole transporting layer 4 is preferably in a range of from 10 nm to 10 mm, and more preferably in a range of from 100 nm to 100 mm. At this thickness, an improvement in the hole transporting properties of the pore transporting layer 4 and an increase in the surface area of the interface are both achieved to a higher degree.

A suitable method is employed to provide the hole transporting layer 4 on the surface of the first electrode 2, such as depositing the first organic compound on the surface of the electrode 2 by a vacuum process (e.g., sputtering or vapor deposition). In particular, a wet forming method that entails applying a solution containing the first organic compound onto the first electrode 2 is preferred because it is a simpler, lower-cost process. In cases where the hole transporting layer 4 is formed of a first organic compound in a "high-molecular-weight form" having a number-average molecular weight of 1,000 or more, the use of a wet forming process is especially preferred from the standpoint of formability. Examples of suitable wet-forming processes include spin coating, drop casting in which liquid drops are dropped onto the electrode surface and dried, and printing methods such as screen printing and gravure printing.

A known material may be used as the sensitizing dye in this embodiment. The sensitizing dye is exemplified by 9-phenylxanthene dyes, coumarin dyes, acridine dyes, triphenylmethane dyes, tetraphenylmethane dyes, quinone dyes, azo dyes, indigo dyes, cyanine dyes, merocyanine dyes and xanthene dyes. Additional examples include $RuL_2(H_2O)_2$ type ruthenium-cis-diaqua-bipyridyl complexes (here, L represents 4,4'-dicarboxyl-2,2'-pipyridine), ruthenium-tris ($RuL_3$), ruthenium-bis($RuL_2$), osmium-tris ($OsL_3$) and osmium-bis($OsL_2$) type transition metal complexes, and zinc-tetra(4-carboxyphenyl)porphyrin, iron-hexacyanide complexes and phthalocyanine. Further examples include dyes such as those in the DSSC chapter of "FPD.DSSC.hikari memorī to kinōsei shikiso no saishin gijutsu to zairyō kaihatsu [Flat panel displays, dye-sensitized solar cells, optoelectronic memories and functional dyes: Recent technologies and materials development]" (published by NTS Inc.). Of the above, sensitized dyes having associative properties are preferred in that they promote charge separation at the time of photoelectric conversion. Sensitizing dyes which have the structural formula in Formula 17 are preferred as sensitizing dyes which form an association complex and exhibit good effects.

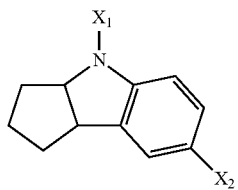

Formula 17

In the structural formula shown in Formula 17, $X_1$ and $X_2$ are each independently an alkyl group, an alkenyl group, an aralkyl group, an aryl group, a heterocyclic group, or an organic group containing at least one of these types of groups; these groups may each have substituents. The sensitizing dye represented by the structural formula in Formula 17 is known to have associative properties. When such a sensitizing dye is used, recombination of the electrons and holes present in the electron transporting material and the hole transporting material dramatically decreases, thereby increasing the conversion efficiency of the photoelectric conversion element.

The sensitizing dye is present in the first gel layer 6. In particular, it is preferable for the sensitizing dye to be fixed within the first gel layer 6 by, for example, physical or chemical actions between the first organic compound making up the first gel layer 6 and the sensitizing dye.

"The sensitizing dye is present in the first gel layer 6" means that the sensitizing dye is present not only in the surface layer of the first gel layer 6, but is present also at the interior. In this way, the amount of sensitizing dye present within the first gel layer 6 is continuously maintained in a state at or above a given value, improving the output of the photoelectric element.

The state in which "the sensitizing dye is present in the first gel layer 6" includes "a state in which the sensitizing dye is present in the electrolyte solution within the first gel layer 6" and "a state in which the sensitizing dye is present in the first gel layer 6 on account of physical or chemical interactions with the first organic compound within the first gel layer 6." Preferably, the sensitizing dye is present throughout the interior of the first gel layer 6.

"A state in which the sensitizing dye is present in the first gel layer 6 on account of physical interactions with the first organic compound within the first gel layer 6" is exemplified by a state in which the first organic compound in the first gel layer 6 has a structure which interferes with the movement of sensitizing dye molecules. Examples of structures which interfere with movement of the sensitizing dye molecules include structures which give rise to steric hindrance on account of various types of molecular chains (e.g., alkyl chains) on the first organic compound, and structures wherein the gaps present between molecular chains of the first organic compound are so small in size as to be capable of inhibiting the movement of sensitizing dye molecules. It is also effective for the sensitizing dye to have factors which give rise to physical interactions. Specifically, it is effective, for example, for the sensitizing dye to have a structure which gives rise to steric hindrance due to various types of molecular chains (e.g., alkyl chains), or for the sensitizing dye to have a structure in which the size of sensitizing dye molecules has increased due to crosslinking between molecules of the sensitizing dye.

"A state in which the sensitizing dye is present in the first gel layer 6 on account of chemical interactions with the first organic compound within the first gel layer 6" is exemplified by a state in which the sensitizing dye is held within the first gel layer 6 by, for example, covalent bonds, coordination bonds, ionic bonds, hydrogen bonds or van der Waals bonds, or by interactions such as forces based on hydrophobic interactions, hydrophilic interactions or electrostatic interactions. In particular, when the sensitizing dye is fixed within the first gel layer 6 by chemical interactions between the sensitizing dye and the first organic compound in the first gel layer 6, the distance between the sensitizing dye and the first organic compound becomes closer, enabling more efficient electron transfer.

In cases where the sensitizing dye is fixed within the first gel layer 6 by chemical interactions between the first organic compound and the sensitizing dye, it is preferable for a functional group to be suitably introduced onto the first organic compound and the sensitizing dye, and for the sensitizing dye to be fixed to the first organic compound by, for example, chemical reactions through this functional group. Examples of such functional groups include hydroxyl groups, carboxyl groups, phosphate groups, sulfo groups, nitro groups, alkyl groups, carbonate groups, aldehyde groups and thiol groups. Moreover, the form of the chemical reaction through the functional group is exemplified by condensation reactions, addition reactions and ring-opening reactions.

When chemical bonding is carried out between the sensitizing dye and the first organic compound in the first gel layer 6, it is preferable for the functional group on the sensitizing dye to be introduced near a site where the electron density becomes low when the sensitizing dye is in a photoexcited state. In addition, it is preferable for the functional group on the first organic compound in the first gel layer 6 to be introduced near a site within the first organic compound which takes part in hole transport. In such a case, the efficiency of electron transfer from the first organic compound to the sensitizing dye and the efficiency of hole transport in the first organic compound increase. In particular, when the sensitizing dye and the first organic compound in the first gel layer 6 are bonded by a bonding radical having high electron transporting properties which connects the electron cloud of the sensitizing dye with the electron cloud of the first organic compound, efficient hole transfer from the sensitizing dye to the first organic compound becomes possible. A specific example of a chemical bond which connects the π electron cloud of the sensitizing dye with the π electron cloud of the first organic compound is an ester bond having a π electron system.

With regard to the timing of bonding between the sensitizing dye and the first organic compound, any one of the following is acceptable: when the first organic compound is in a monomer state, when the first organic compound is polymerized, when the first organic compound is gelated following polymerization, and following gelation of the first organic compound. Examples of specific methods include a method in which a hole transporting layer 4 that has been formed of the first organic compound is immersed in a bath containing the sensitizing dye, and a method in which the hole transporting layer 4 is obtained by film formation involving the application of a coating liquid containing the first organic compound and a sensitizing dye onto the second electrode 5. A combination of a plurality of methods is also possible.

The content of sensitizing dye in the first gel layer 6 is set as appropriate. However, when the sensitizing dye content is at least 0.1 part by weight per 100 parts by weight of the first organic compound in particular, the amount of sensitizing dye per unit film thickness of the first gel layer 6 becomes sufficiently high and the light absorbing ability of the sensitizing dye increases, enabling a high current value to be obtained. In particular, when the sensitizing dye content is not more than 1,000 parts by weight per 100 parts by weight of the first organic compound, the presence of an excessive amount of sensitizing dye among the first organic compound is suppressed and, in turn, the inhibition of electron transfer among the first organic compound by the sensitizing dye is suppressed, ensuring a high conductivity.

The electron transporting material which makes up the electron transporting layer 3 is exemplified by an electrolyte solution obtained by dissolving an electrolyte such as a redox pair in a solvent.

When the electron transporting layer 3 is composed of an electrolyte solution, the electrolyte solution making up the first gel layer 6 forms the electron transporting layer 3. In such a case, the electrolyte solution in the first gel layer 6 forms part of the electron transporting layer 3.

Preferred examples of the electron transporting material include phenoxyl derivatives such as the galvinohydroxyl radical shown in Formula 18, viologen derivatives such as the methyl viologen shown in Formula 19, the imide derivatives shown in Formula 20(a) and Formula 20(b), and the quinone derivatives shown in Formula 21. Here, the electrons generated by charge separation are efficiently transported to the electrode by very rapid electron transfer reactions, thereby increasing the photoelectric conversion efficiency of the photoelectric element.

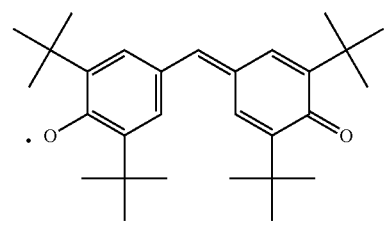

Formula 18

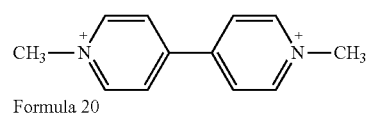

Formula 19

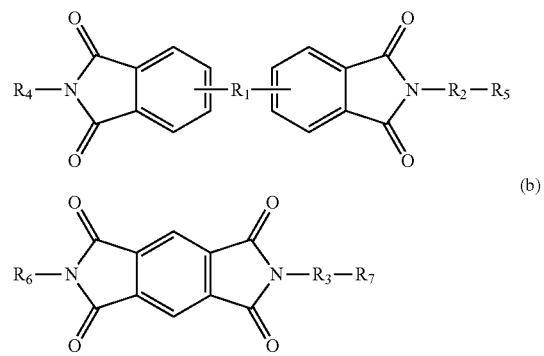

Formula 20

(a)

(b)

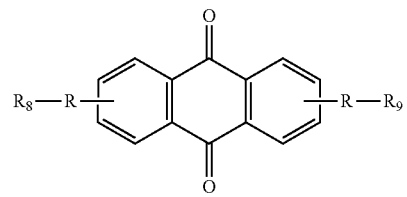

Formula 21

In Formula 20(a) and Formula 20(b) and Formula 21, R and $R_1$ to $R_3$ are each independently an aromatic group such as phenylene and phenylene, an aliphatic chain such as an alkylene group or an alkyl ether, or an ether group. The substituents $R_4$ to $R_9$ are each independently a hydrogen atom, a substituted or unsubstituted aliphatic or aromatic $C_{1-30}$ hydrocarbon group, a halogen group, a hydroxyl group, a nitro group, a nitroso group, a cyano group, an alkoxy group, an aryloxy group or an acyl group.

The concentration of the electron transporting material in the electrolyte solution is preferably from 0.05 mM to 5 M, and more preferably from 0.005 to 0.1 M.

When fabricating the photoelectric element, by using a wet process or the like to deposit a layer of the first organic compound on the second electrode 5 that has been provided on the second base material 8, a positive transporting layer 4 is formed on the second electrode 5 so as to be fixed thereto. The electron transporting layer 3 and the first electrode 2 are disposed on this hole transporting layer 4. In cases where the electron transporting layer 3 is composed of an electrolyte solution, the electron transporting layer 3 is formed by, for example, sealing the gap between the first electrode 2 provided on the first base material 1 and the hole transporting layer 4 provided on the second base material 8 with a sealant, and filling this gap between the hole transporting layer 4 and the first electrode 2 with the electrolyte solution. At this time, some of the electrolyte solution permeates the hole transporting layer 4, causing the first organic compound making up this hole transporting layer 4 to be swollen and thereby forming the first gel layer 6.

The photoelectric element constructed as described above functions as a photoelectric conversion element. When this photoelectric conversion element is irradiated with light so that the light passes from the second base material 8 side to the second electrode 5 or so that the light passes from the first base material 1 side to the first electrode 2, the sensitizing dye absorbs the light and becomes excited to generate excited electrons. The excited electrons flow into the electron transporting layer 3 and are extracted to the exterior through the first electrode 2. Holes in the sensitizing dye flow through the hole transporting layer 4 and are extracted to the exterior through the second electrode 5.

The photoelectric element according to this embodiment has a high power storage capacity. That is, when the photoelectric element is shielded from light after having been irradiated with light, the open circuit voltage maintenance is high. The open circuit voltage maintenance is defined as the percentage (%) of B relative to A ((B/A)×100), where A (V) represents the open circuit voltage of the photoelectric element after 300 seconds of irradiation with 200 lux light and B(V) represents the open circuit voltage of the photoelectric element after being held for 5 minutes in a light-shielded state following such irradiation. In the photoelectric element according to this embodiment, an open circuit voltage maintenance of 10% or more is possible. That is, it is possible for A and B above to satisfy the following condition:

$$(B/A) \times 100 \geq 10.$$

The reason is conjectured to be that, in this embodiment, the movement of holes that were held in the hole transporting layer 4 to the mediator (the electron transporting material which forms the electron transporting layer) is suppressed. When a photoelectric element having such high power storage characteristics is used as a power supply, the destabilization of power supply depending on the presence or absence of light irradiation is suppressed.

In this embodiment, the organic compounds making up the electron transporting layer 3 and the hole transporting layer 4 include as part of the molecule redox moieties capable of repeated oxidation and reduction, and may also have, as another part of the molecule, sites which is capable of swollen with the electrolyte solution to form a gel (gel sites). That is, in addition to the hole transporting layer being composed of an organic compound (first organic compound) and the first gel layer 6 being composed of this first organic compound and an electrolyte solution, as shown in FIG. 2, the electron transporting layer 3 is composed of an organic compound (second organic compound), and the second gel layer 7 is composed of this second organic compound and the electrolyte solution.

Figure 2:
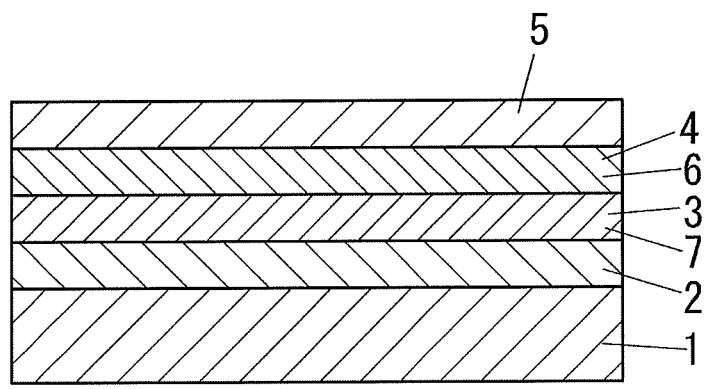
FIG. 2 is a schematic cross-sectional diagram showing another embodiment of the invention.

In FIG. 2, in cases where a first electrode 2 made of a transparent conductive oxide layer composed of, e.g., indium oxide, tin oxide or zinc oxide is formed on a first base material 1, the first electrode 2 may be formed on a transparent first base material 1 composed of glass, resin or the like by a vacuum process such as sputtering or vapor deposition, or the first electrode 2 may be formed by a wet process such as spin coating, spraying or screen printing. Moreover, a second base material like the above first base material 1 may be disposed on a surface of a second electrode 5 on the opposite side thereof from a hole transporting layer 4. In such a case, as with the first electrode 2, the second electrode 5 may be formed on the second base material.

The second organic compound having the above type of redox moieties and gel sites on a single molecule may be represented by, as with the first organic compound, the following general formula:

$$(X_i)_{nj} : Y_k.$$

$(X_i)_n$ and $(X_i)_{nj}$ represent gel sites, and $X_i$ represents a monomer of the compound which forms the gel sites. The gel sites may be composed of a polymer bone. The degree of polymerization n of the monomer is preferably in a range of n=1 to 100,000. Y represents the redox moieties which are bonded to X. The letters j and k are respectively any integer representing the number of occurrences of $(X_i)_n$ and Y included in a single molecule, and are each preferably in a range of from 1 to 100,000. The redox moieties Y may be bonded at any site on the polymer bone which makes up the gel sites $(X_i)_n$ and $(X_i)_{nj}$. The redox moieties Y may include different types of materials (atomic groups), in which case, from the standpoint of the electron exchange reactions, materials (atomic groups) having close redox potentials are preferred.

The second organic compound which has redox moieties and gel sites on one molecule and functions as the electron transporting layer 3 is exemplified by polymers having a quinone derivative bone composed of chemically bonded quinone, polymers having an imide derivative bone containing imide, polymers having a phenoxyl derivative bone containing phenoxyl, and polymers having a viologen derivative bone containing viologen. In these organic compounds, the respective polymer bones become the gel sites, and the quinone derivative bone, imide derivative bone, phenoxyl derivative bone or viologen derivative bone becomes the respective redox moieties.

Of the above organic compounds, examples of polymers having a quinone derivative bone in which quinones are chemically bonded include compounds of the chemical structures shown in Formula 22 to Formula 25 below. In Formula 22 to Formula 25, R is a saturated or unsaturated hydrocarbon such as methylene, ethylene, propan-1,3-dienyl, ethylidene, propan-2,2-diyl, alkanediyl, benzylidene, propylene, vinylidene, propen-1,3-diyl and but-1-en-1,4-diyl; a cyclic hydrocarbon such as cyclohexanediyl, cyclohexenediyl, cyclohexadienediyl, phenylene, naphthalene and biphenylene; a keto or divalent acyl group such as oxalyl, malonyl, succinyl, glutanyl, adipoyl, alkanedioyl, sebacoyl, fumaroyl, maleoyl, phthaloyl, isophthaloyl or terephthaloyl; an ether or ester such as oxy, oxymethylenoxy or oxycarbonyl; a sulfur-containing group such as sulfanediyl, sulfenyl or sulfonyl; a nitrogen-containing group such as imino, nitrilo, hydrazo, azo, azino, diazoamino, urylene or amide; a silicon-containing group such as silanediyl or disilane-1,2-diyl; or any of these groups in which the end of the group has been substituted or combined.

Formula 22 is an example of an organic compound in which anthraquinone is chemically bonded to a polymer main chain. Formula 23 is an example of an organic compound in which anthraquinone which has been introduced as a recurring unit onto a polymer main chain. Formula 24 is an example of an organic compound in which anthraquinone serves as a crosslinking unit. Formula 25 is an example of anthraquinone having a proton-donating group which forms an intramolecular hydrogen bond with an oxygen atom.

Formula 22

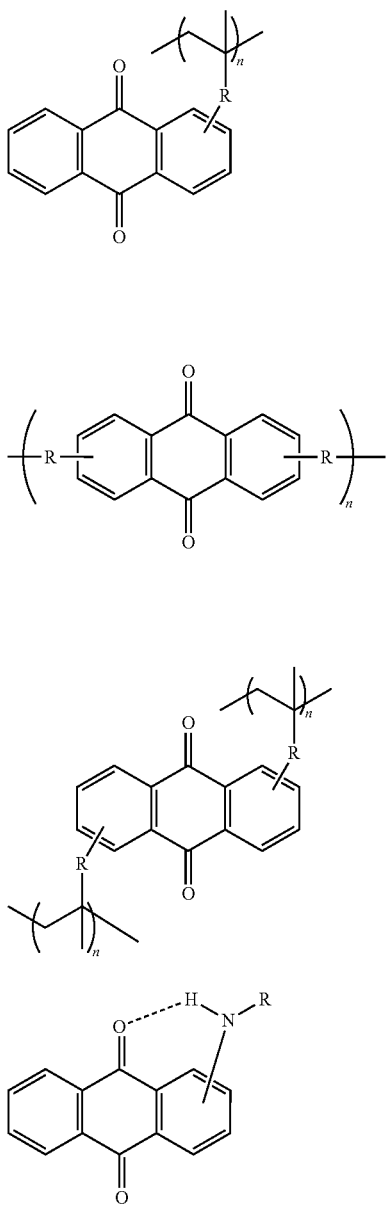

Formula 23

Formula 24

Formula 25

Formula 26

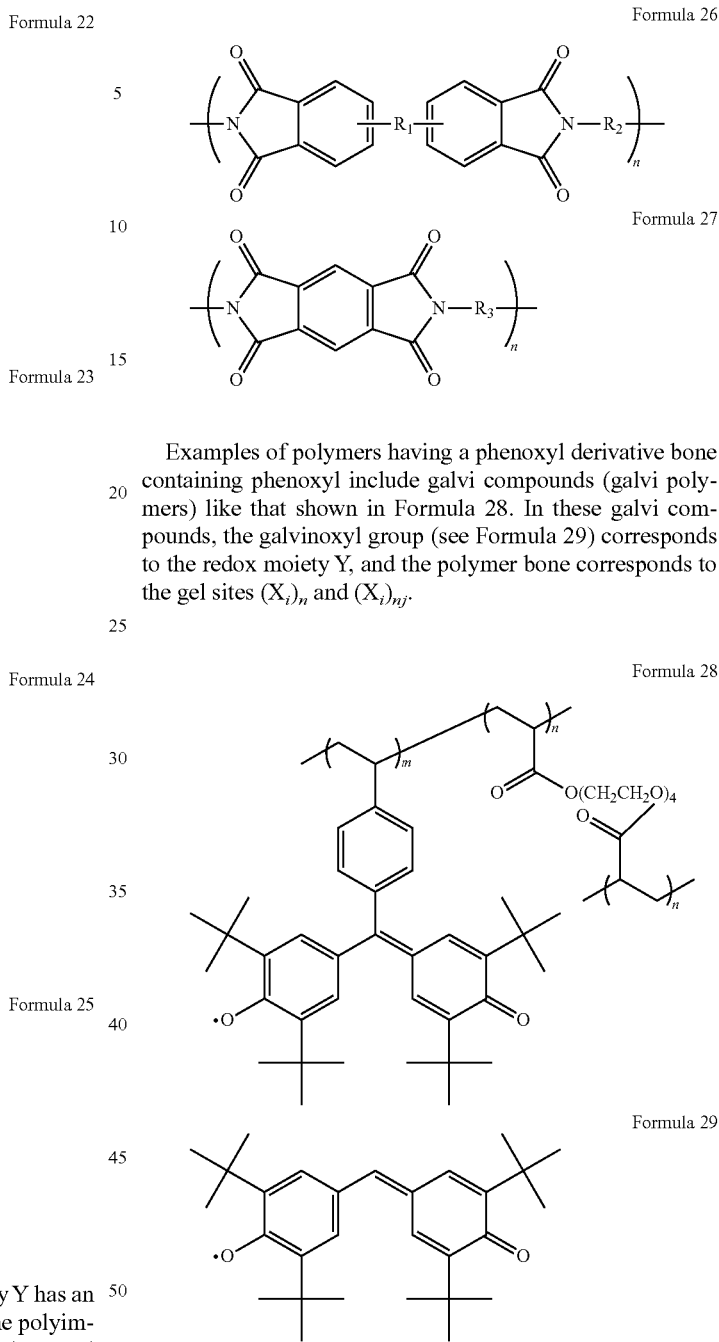

Formula 27

Examples of polymers in which the redox moiety Y has an imide derivative bone containing imides include the polyimides shown in Formula 26 and Formula 27. In Formula 26 and Formula 27, $R_1$ to $R_3$ are exemplified by aromatic groups such as phenylene; aliphatic chains such as alkylenes or alkyl ethers; and ether groups. Such polyimides may be obtained by thermal imidization. The polyimide polymer bone may be crosslinked at the $R_1$ to $R_3$ moieties. If the second organic compound merely is swollen in the solvent and does not dissolve out, the polyimide polymer bone need not have a crosslinked structure. In cases where the polyimide polymer bone is crosslinked at the $R_1$ to $R_3$ moieties, those moieties correspond to the gel sites $(X_i)_n$ and $(X_i)_{nj}$. In cases where the polyimide polymer bone has a crosslinked structure, imide groups may be included in the crosslinked units. If the imide groups exhibit electrochemically reversible redox characteristics, a phthalimide, pyromellitimide or the like is preferred.

Examples of polymers having a phenoxyl derivative bone containing phenoxyl include galvi compounds (galvi polymers) like that shown in Formula 28. In these galvi compounds, the galvinoxyl group (see Formula 29) corresponds to the redox moiety Y, and the polymer bone corresponds to the gel sites $(X_i)_n$ and $(X_i)_{nj}$.

Formula 28

Formula 29

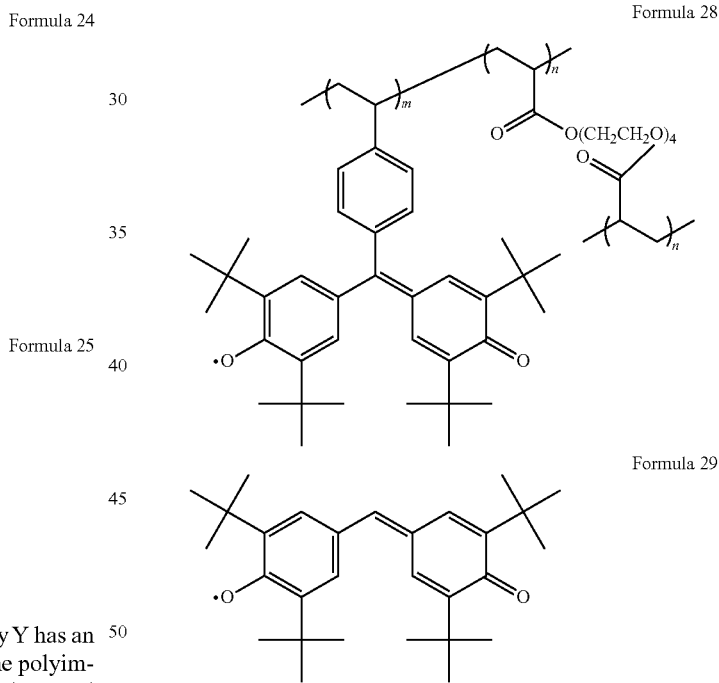

Examples of polymers having a viologen derivative bone containing viologen include polyviologen polymers such as those shown in Formula 30 and Formula 31. In these polyviologen polymers, Formula 32 corresponds to the redox moiety Y, and the polymer bone corresponds to the gel sites $(X_i)_n$ and $(X_i)_{nj}$.

Formula 30

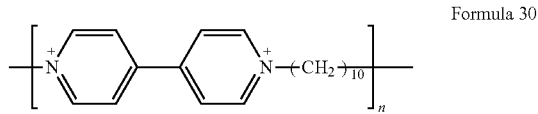

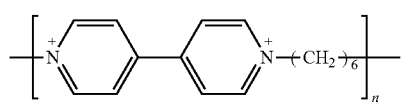

Formula 31

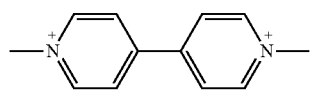

Formula 32

In Formula 22 to Formula 24, Formula 26 to Formula 28 and Formula 30 and Formula 31, the letters m and n represent the degree of polymerization of the monomer. Each is preferably in a range of from 1 to 100,000.

As explained above, the organic compound having the above redox moieties and a polymer bone is with electrolyte solution, which presents within the bone, and is swollen to form a gel layer 6. Because electrolyte solution is included in the electron transporting layer 3, the ionic state that forms due to redox reactions at the redox moieties is compensated by counterions in the electrolyte solution, stabilizing the redox moieties.

In the photoelectric element, the electron transporting layer 3 is composed in such a way that the redox potential is noble relative to the hole transporting layer 4. That is, the potential of the electrode 2 on which the electron transporting layer 3 has been provided is higher than the potential of the electrode 5 on which the hole transporting layer 4 has been provided, as a result of which the photoelectric element achieves a higher output. From a different perspective, the hole transporting layer 4 may be regarded as having a lower redox potential than the electron transporting layer 3.

In cases where the second organic compound making up the electron transporting layer 3 and the first organic compound making up the hole transporting layer 4 have redox moieties and gel sites, the electron transporting layer 3 is composed so as to have a higher redox potential than the hole transporting layer 4, and the second organic compound making up the electron transporting layer 3 has a higher redox potential than the first organic compound making up the hole transporting layer 4. Conversely, the first organic compound making up the hole transporting layer 4 has a redox potential which is lower than the that of the second organic compound making up the electron transporting layer 3. Because such a difference in the redox potentials exists between the organic compounds in the respective layers, it is possible for one of the two gel layers to function as the electron transporting layer 3 and for the other to function as the hole transporting layer 4. Also, the gel layer 6 making up the electron transporting layer 3 exhibits a function similar to an n-type semiconductor, and may thus be referred to as an "n-gel" (n-type gel layer). On the other hand, the gel layer 7 making up the hole transporting layer 4 exhibits a function similar to a p-type semiconductor, and may thus be referred to as a "p-gel" (p-type gel layer). Thus, in this case, the photoelectric element is a device having a construction in which gel-like bodies composed of an n-gel and a p-gel are disposed between the electrodes 2 and 5.

The potential difference between the electron transporting layer 3 and the hole transporting layer 4 (a potential difference such that the electron transporting layer 3 has a redox potential which is noble relative to the hole transporting layer 4) is obtained by having the electron transporting layer 3 and the hole transporting layer 4 be composed of the above-described organic compounds. That is, the second organic compound making up the above-described electron transporting layer 3 has a higher redox potential than the first organic compound making up the above-described hole transporting layer 4.

The potential difference between the electron transporting layer 3 and the hole transporting layer 4 is preferably at least 200 mV and not more than 2,000 mV. At a potential difference below 200 mV, the photoelectric element will not readily achieve a high open circuit voltage, which may make it difficult to generate a high output. On the other hand, at a potential difference greater than 2,000 mV, the light energy required for photoelectric conversion in the photoelectric element becomes larger, so that only short wavelength light can be utilized in photoelectric conversion, as a result of which it may be difficult to obtain a high output.

The electron transporting layer 3 and the hole transporting layer 4 have thicknesses which, from the standpoint of maintaining good electron or hole transporting properties, are each preferably in a range of from 10 nm to 10 mm, and more preferably in a range of from 100 nm to 100 μm. At this thickness, improvement in the electron or hole transporting properties and a larger interfacial surface area can both be achieved to a higher degree.

In cases where the second organic compound making up the electron transporting layer 3 and the first organic compound making up the hole transporting layer 4 have redox moieties and gel sites, the photoelectric element may be fabricated by employing a method wherein the first electrode 2, the electron transporting layer 3, the hole transporting layer 4 and the second electrode 5 are successively stacked in this order or in the reverse order, or by employing a method wherein the electron transporting layer 3 is provided on the surface of the first electrode 2, the hole transporting layer 4 is provided on the surface of the second electrode 5, then the first electrode 2 and the second electrode 5 are arranged over one another and stacked together at the sides on which the electron transporting layer 3 and the hole transporting layer 4 have been provided. This is not limited to cases where the electron transporting layer 3 and the hole transporting layer 4 are in contact; an electrolyte solution layer may be formed between the electron transporting layer 3 and the hole transporting layer 4. That is, a layer of an electrolyte solution which is not present in the first gel layer 6 and the second gel layer 7 may be formed between these gel layers 6 and 7.

In providing the electron transporting layer 3 on the surface of the first electrode 2 or providing the hole transporting layer 4 on the surface of the second electrode 5, employing a wet forming method which involves applying a solution or the like containing the organic compound is preferred in that it is a simpler and low-cost method. Particularly in cases where the electron transporting layer 3 or the hole transporting layer 4 is formed of a high-molecular-weight organic compound having a number-average molecular weight of 1,000 or more, a wet formation method is preferred from the standpoint of formability. Examples of wet processes include spin coating, drop casting which involves depositing and drying liquid drops, and printing methods such as screen printing or gravure printing. In addition, vacuum processes such as sputtering or vapor deposition may be used.

In cases where the second organic compound making up the electron transporting layer 3 and the first organic compound making up the hole transporting layer 4 have redox moieties and gel sites, the electrolyte solution permeates the respective organic compounds, causing these organic compounds to be swollen, and is thus a part of the gel layers 6 and 7. This electrolyte solution also functions as a medium for making the transfer of charge within the gel layers 6 and 7 smooth. This electrolyte solution additionally functions to stabilize the redox state of the redox moieties within the organic compounds. In the second gel layer 7, the electrolyte solution stabilizes in particular the reduced state of the redox moieties in the second organic compound making up the electron transporting layer 3. In the first gel layer 6, the electrolyte solution stabilizes in particular the oxidized states of the redox moieties in the first organic compound making up the hole transporting layer 4. Because the oxidized and reduced states of the organic compounds are stabilized by the electrolyte solution, the structures of the organic compounds which transfer electrons are stabilized, enabling a high photoelectric conversion ability to be obtained.

In cases where the second organic compound making up the electron transporting layer 3 and the first organic compound making up the hole transporting layer 4 have redox moieties and gel sites, the electrolyte solution need only contain an electrolyte and a solvent. The electrolyte is exemplified by a supporting salt and a redox system-type component having an oxidized form and a reduced form, and may be either one of these or both. Illustrative examples of the supporting salt (supporting electrolyte) include ammonium salts such as tetrabutylammonium perchlorate, tetraethylammonium hexafluorophosphate, imidazolium salts and pyridinium salts; and alkali metal salts such as lithium perchlorate and potassium tetrafluoroborate. Here, "redox system-type component" refers to a substance which, in a redox reaction, is reversibly present in an oxidized form and a reduced form. Illustrative, non-limiting, examples of such redox system-type components include chlorine compound—chlorine, iodine compound—iodine, bromine compound—bromine, thallium (III) ion—thallium (I) ion, mercury (II) ion—mercury (I) ion, ruthenium (III) ion—ruthenium (II) ion, copper (II) ion—copper (I) ion, iron (III) ion—iron (II) ion, nickel (II) ion—nickel (III) ion, vanadium (III) ion—vanadium (II) ion, manganate ion—permanganate ion. Such redox system-type components function in a way that is distinguishable from the redox moieties in the electron transporting layer 3 and the hole transporting layer 4.

In cases where an electrolyte solution layer is present as described above, that is, in cases where a layer of an electrolyte solution that does not make up the first gel layer 6 and the second gel layer 7 is present between the electron transporting layer 3 and the hole transporting layer 4, this electrolyte solution layer may be held by a polymer matrix. The polyvinylidene fluoride-based polymer compound used as the polymer matrix is exemplified by vinylidene fluoride homopolymers and copolymers of vinylidene fluoride with other polymerizable monomers, preferably copolymers of vinylidene fluoride with radical polymerizable monomers. Examples of the other polymerizable monomers which copolymerize with vinylidene fluoride (referred to below as "copolymerizable monomers") include hexafluoropropylene, tetrafluoroethylene, trifluoroethylene, ethylene, propylene, acrylonitrile, vinylidene chloride, methyl acrylate, ethyl acrylate, methyl methacrylate and styrene.

The solvent making up the electrolyte solution includes at least one from among water, organic solvents and ionic liquids.

When water or an organic solvent is used as the solvent of the electrolyte solution, the reduced state or oxidized state of the redox moieties of the organic compound is stabilized, as a result of which electrons or holes are more stably transported. Any aqueous solvent or organic solvent may be used as the solvent, although organic solvents having an excellent ionic conductivity are preferred for better stabilizing the redox moiety. Illustrative examples of such organic solvents include carbonate compounds such as dimethyl carbonate, diethyl carbonate, methyl ethyl carbonate, ethylene carbonate and propylene carbonate; ester compounds such as methyl acetate, methyl propionate and γ-butyrolactone; ether compounds such as diethyl ether, 1,2-dimethoxyethane, 1,3-dioxosilane, tetrahydrofuran and 2-methyltetrahydrofuran; heterocyclic compounds such as 3-methyl-2-oxazolidinone and 2-methylpyrrolidone; nitrile compounds such as acetonitrile, methoxyacetonitrile and propionitrile; and aprotic polar compounds such as sulfolane, dimethylsulfoxide and dimethylformamide. These solvents may be used singly or two or more may be mixed and used in combination. Particularly in cases where the photoelectric element is to be formed as a photoelectric conversion element, from the standpoint of increasing the solar cell output properties, it is preferable for the solvent to be a carbonate compound such as ethylene carbonate or propylene carbonate; a heterocyclic compound such as γ-butyrolactone, 3-methyl-2-oxazolidinone or 2-methylpyrrolidone; or a nitrile compound such as acetonitrile, methoxyacetonitrile, propionitrile, 3-methoxypropionitrile or valeronitrile.

When an ionic liquid is used as the solvent of the electrolyte solution, the redox moiety stabilizing action by the electrolyte solution is particularly enhanced. Moreover, because ionic liquids lack volatility and have a high non-flammability, the stability is excellent. Any known ionic liquid may be used here as the ionic liquid. Illustrative examples include imidazolium-based (e.g., 1-ethyl-3-methylimidazolium tetracyanoborate), pyridine-based, alicyclic amine-based, aliphatic amine-based, and azonium amine based ionic liquids; and the ionic liquids mentioned in European Patent Specification No. 718288, WO95/18456, *Denki Kagaku* 65, No. 11, 923 (1997), *J. Electrochem. Soc.* 143, No. 10, 3099 (1996), and *Inorg. Chem.* 35, 1168 (1996).

The concentration of the electrolyte solution, i.e., the amount of electrolyte relative to the total amount of the electrolyte solution (combined amount of electrolyte and solvent), is preferably from 0.1 to 10 mol/L. By having the concentration of the electrolyte solution fall in this range, the redox state that arises at the redox moieties of the organic compound stabilizes further.

The electrolyte solution causes the above-described organic compounds of the electron transporting layer 3 and the hole transporting layer 4 to be swollen, and thus becomes a part of gel layers 6 and 7. That is, the first organic compound, which composes the hole transporting layer 4, is swollen with the electrolyte solution to form the first gel layer 6, and the electrolyte solution which has permeated the hole transporting layer 4 becomes a part of the first gel layer 6. Likewise, of the first organic compound, which composes the electron transporting layer 3, is swollen with the electrolyte solution to form the second gel layer 7, and the electrolyte solution which has permeated the electron transporting layer 3 becomes a part of the second gel layer 7. Therefore, the electrolyte solution either is not present in a liquid state (a flowable state) within the photoelectric element or is present as a liquid in only a small amount. Because the gel layers 6 and 7 support the electrolyte solution in this way, it is possible to provide a photoelectric element which is free of the problem of electrolyte solution leakage.

In cases where the second organic compound making up the electron transporting layer 3 and the first organic compound making up the hole transporting layer 4 have redox moieties and gel sites, the degree of swelling of the first gel layer 6 and the second gel layer 7 is preferably from 110 to 3,000%, and more preferably from 150 to 500%. At less than 110%, the amount of the electrolyte component in the gel becomes small, as a result of which sufficient stabilization of the redox moiety may become impossible. On the other hand, at more than 3,000%, the number of redox moieties in the gel becomes small, which may lower the electron transporting capacity. In both cases, the properties of the photoelectric element may decrease.

In cases where the second organic compound making up the electron transporting layer 3 and the first organic compound making up the hole transporting layer 4 have redox moieties and gel sites, the photoelectric element preferably includes a sensitizing dye which carries out electron transfer reactions with one or both of the electron transporting layer 3 and the hole transporting layer 4. The inclusion of a sensitizing dye in the photoelectric element further increases the photoelectric conversion efficiency of the photoelectric element. Here, "electron transfer reaction" refers to a reaction involving an interaction in which an electron is given to or received from one or both of the electron transporting layer 3 and the hole transporting layer 4. Cases where an electron is received from one of the electron transporting layer 3 and the hole transporting layer 4 generally have the effect of giving an electron to the other of the electron transporting layer 3 and the hole transporting layer 4. That is, when a sensitizing dye receives an electron from the electron transporting layer 3, the dye generally exhibits the action of giving an electron to the hole transporting layer 4, and when a sensitizing dye receives an electron from the hole transporting layer 4, the dye generally exhibits the action of giving an electron to the electron transporting layer 3. From a different perspective, this could also be called a hole transfer reaction involving the giving and receiving of a hole.

Known materials such as those mentioned above may be used as the sensitizing dye. Illustrative examples include the subsequently described D131 and K19. Of these, dyes having associative properties on a film pack densely and cover the film surface, and are thus preferred from the standpoint of promoting charge separation during photoelectric conversion. A preferred example of a dye which has an effect involving the formation of an association complex is the dye having the structural formula in Formula 17. In this case, recombination of the electrons and holes present in the electron transporting material and the hole transporting material dramatically decreases, as a result of which the conversion efficiency of the photoelectric conversion element improves.

In the photoelectric element, the sensitizing dye is present within the gel layers 6 and 7. In particular, it is preferable for the sensitizing dye to be fixed within the gel layers 6 and 7 by physical or chemical actions between the dye and the organic compounds making up the gel layers 6 and 7. That is, the sensitizing dye is preferably fixed within the first gel layer 6 by physical or chemical actions between the sensitizing dye and the first organic compound making up the first gel layer 6, the sensitizing dye is preferably fixed within the second gel layer 7 by physical or chemical actions between the sensitizing dye and the second organic compound making up the second gel layer 7.

"The sensitizing dye is fixed within the second gel layer 7" means that the sensitizing dye is not present only in the surface layer of the second gel layer 7, but is present also at the interior. In this way, the amount of sensitizing dye present within the second gel layer 7 is continuously maintained in a given state at a given value or more, improving the output of the photoelectric element.

"States in which the sensitizing dye is present in the second gel layer 7" include both "a state in which the sensitizing dye is present in the electrolyte solution making up the second gel layer 7," and "a state in which the sensitizing dye is present within the second gel layer 7 through physical or chemical interactions with the organic compound making up the second gel layer 7." Preferably, the sensitizing dye is present throughout the interior of the second gel layer 7.

"A state in which the sensitizing dye is held within the second gel layer 7 by physical interactions with the second organic compound making up the second gel layer 7" is exemplified by a state in which the second organic compound making up the second gel layer 7 has a structure which interferes with the movement of sensitizing dye molecules. Examples of structures which interfere with movement of the sensitizing dye molecules include structures which give rise to steric hindrance on account of various types of molecular chains (e.g., alkyl chains) on the second organic compound, and structures wherein the gaps present between molecular chains of the second organic compound are so small in size as to be capable of inhibiting the movement of sensitizing dye molecules. It is also effective for the sensitizing dye to have factors which give rise to physical interactions. Specifically, it is effective, for example, for the sensitizing dye to have a structure which gives rise to steric hindrance due to various types of molecular chains (e.g., alkyl chains), or for the sensitizing dye to have a structure in which the size of sensitizing dye molecules has increased due to crosslinking between molecules of the sensitizing dye.

"A state in which the sensitizing dye is present in the second gel layer 7 on account of chemical interactions with the second organic compound within the second gel layer 7" is exemplified by a state in which the sensitizing dye is held within the second gel layer 7 by, for example, covalent bonds, coordination bonds, ionic bonds, hydrogen bonds or van der Waals bonds, or by interactions such as forces based on hydrophobic interactions, hydrophilic interactions or electrostatic interactions. In particular, when the sensitizing dye is fixed within the second gel layer 7 by chemical interactions between the sensitizing dye and the second organic compound in the second gel layer 7, the distance between the sensitizing dye and the second organic compound becomes closer, enabling more efficient electron transfer.

In cases where the sensitizing dye is fixed within the second gel layer 7 by chemical interactions between the second organic compound and the sensitizing dye, it is preferable for a functional group to be suitably introduced onto the second organic compound and the sensitizing dye, and for the sensitizing dye to be fixed to the second organic compound by, for example, chemical reactions through this functional group. Examples of such functional groups include hydroxyl groups, carboxyl groups, phosphate groups, sulfo groups, nitro groups, alkyl groups, carbonate groups, aldehyde groups and thiol groups. Moreover, the form of the chemical reaction through the functional groups is exemplified by condensation reactions, addition reactions and ring-opening reactions.

When chemical bonding is carried out between the sensitizing dye and the second organic compound in the second gel layer 7, it is preferable for the functional groups on the sensitizing dye to be introduced near a site where the electron density becomes low when the sensitizing dye is in a photoexcited state. In addition, it is preferable for the functional groups on the second organic compound in the second gel layer 7 to be introduced near a site within the second organic compound which takes part in electron transport. In such a case, the efficiency of electron transfer from the second organic compound to the sensitizing dye and the efficiency of electron transport in the second organic compound increase. In particular, when the sensitizing dye and the second organic compound in the second gel layer 7 are bonded by a bonding radical having high electron transporting properties which connects the electron cloud of the sensitizing dye with the electron cloud of the second organic compound, efficient electron transfer from the sensitizing dye to the second organic compound becomes possible. A specific example of a chemical bond which connects the n electron cloud of the sensitizing dye with the n electron cloud of the second organic compound is an ester bond having a n electron system.

With regard to the timing of bonding between the sensitizing dye and the second organic compound, any one of the following is acceptable: when the second organic compound is in a monomer state, when the second organic compound is polymerized, when the second organic compound is gelated following polymerization, and following gelation of the second organic compound. Examples of specific methods include a method in which an electron transporting layer 3 that has been formed of the second organic compound is immersed in a bath containing the sensitizing dye, and a method in which the electron transporting layer 3 is obtained by film formation involving the application of a coating liquid containing the second organic compound and a sensitizing dye onto the first electrode 2. A combination of a plurality of methods is also possible.

The content of sensitizing dye in the second gel layer 7 is set as appropriate. However, when the sensitizing dye content is at least 0.1 part by weight per 100 parts by weight of the second organic compound in particular, the amount of sensitizing dye per unit film thickness of the second gel layer 7 becomes sufficiently high and the light absorbing ability of the sensitizing dye increases, enabling a high current value to be obtained. In particular, when the sensitizing dye content is not more than 1,000 parts by weight per 100 parts by weight of the second organic compound, the presence of an excessive amount of sensitizing dye among the second organic compound is suppressed and, in turn, the inhibition of electron transfer among the second organic compound by the sensitizing dye is suppressed, ensuring a high conductivity.

By thus forming the electron transporting layer 3 and the hole transporting layer 4 as gel layers 6 and 7 and introducing a sensitizing dye which interacts with either or both of the electron transporting layer 3 and the hole transporting layer 4, it is possible to provide a photoelectric element having a sufficiently large reaction interface and an excellent conversion efficiency.

When dye is introduced into both the electron transporting layer 3 and the hole transporting layer 4, photoelectric conversion takes place in both layers. That is, light is converted to electricity, or electricity is converted to light, not only at the interface between either the electron transporting layer 3 or the hole transporting layer 4 and the dye, but at both the interface where the electron transporting layer 3 is in contact with the dye and at the interface where the hole transporting layer 4 is in contact with the dye. The result is a photoelectric element which has an even higher photoelectric conversion efficiency and thus a high output. This power generating (photoelectric converting) effect at both the electron transporting layer 3 and the hole transporting layer 4 may be referred to as "double power generation." Moreover, if a photoelectric element is constructed in such a way that this double power generation is achieved using one dye in contact with the electron transporting layer 3 and using a different dye in contact with the hole transporting layer 4, i.e., using a plurality of dyes, an even higher output photoelectric element in which the dyes in contact with the respective layers have been optimized can be obtained.

In photoelectric elements constructed in such a way that, as described above, the second organic compound making up the electron transporting layer 3 and the first organic compound making up the hole transporting layer 4 have redox moieties and gel sites, the electron transporting layer 3 and the hole transporting layer 4 are formed of organic compounds having redox moieties capable of repeated oxidation and reduction. Moreover, the organic compounds are with the electrolyte solution which stabilizes the reduced state of the redox moiety to form gel layers 6 and 7. Hence, in this photoelectric element, the structure is compartmentalized at the molecular level, the large reaction interface is large, and electrons can be efficiently transported at a rapid reaction rate.

Moreover, by forming the electron transporting layer and the hole transporting layer of the gel layers 6 and 7 which are composed of redox moiety-containing organic compounds, the organic compounds can be held so as to be at a sufficiently close distance to enable the redox moieties to be maintained near the electrodes or so as to enable mutually neighboring redox moieties to exchange electrons therebetween. It is also possible for the redox moieties to be present at a high density in the electron transporting layer 3 and the hole transporting layer 4. In this way, a very rapid electron self-exchange reaction rate constant can be achieved, enabling the electron transporting ability to be increased.

Furthermore, by forming the electron transporting layer 3 and the hole transporting layer 4 as organic compound gel layers 6 and 7, these layers can easily be conferred with flexibility and light transmitting properties.

Because redox moieties are present within the molecules of the organic compound making up gel layers 6 and 7, the redox moieties are more easily held by the gel layers 6 and 7 in a state where electron transport by repeated redox reactions is more effectively carried out. That is, because the redox moieties are chemically bonded to the organic compounds making up gel layers 6 and 7, the redox moieties can be held by the gel layers 6 and 7 in such a way that the redox moieties are confined to positions where electrons are easily transported. With regard to the relative positions of redox moieties within the organic compounds, the organic compounds making up the gel layers 6 and 7 may have a structure in which the redox moieties are disposed as side chains on the bones of the organic compounds, or the bones of the organic compounds and the redox moieties may be bonded in an alternating or partially continuous arrangement.

The redox moieties are able to transport electrons by an electron exchange reaction between the redox moieties rather than by diffusion. This electron exchange reaction is one in which a redox moiety in an oxidized state oxidizes a nearby redox moiety in a reduced state, and thus the reaction exchanges electrons between both redox moieties. It appears as if electrons or holes are transported in this way within the layer. This resembles the function of an ion-conductive material in which ions are conducted by diffusion, although the foregoing electron transporting mechanism differs in that the redox moieties do not diffuse; instead, electrons are transported by exchange with neighboring redox moieties. In the electron transporting layer 3 and the hole transporting layer 4 as well, in order to pass an electron to a neighboring redox moiety, the redox moieties must be in close mutual proximity to enable electron transfer. Because the redox moieties are held by the gel layers 6 and 7, the transfer distance is expected to be on the order of several angstroms. In those cases in particular where redox moieties like those described above are present inside the molecules of the organic compounds making up the gel layers 6 and 7, reactions involving an exchange of electrons with neighboring redox moieties are called electron self-exchange reactions.

Therefore, in the photoelectric elements of the invention, because the redox moieties are held by the gel layers 6 and 7 as described above, it is possible to increase the reaction site, i.e., the reaction interface, for converting light into electricity, or electricity into light, without a loss of electron transportability, thus enabling photoelectric elements having a high conversion efficiency to be obtained.

Here, "reaction interface" refers to the interface between the electron transporting layer and the hole transporting material or electrolyte solution. For example, in a photoelectric element, because the charge that arises due to light absorption separates at the reaction interface, the conversion efficiency will be higher at a larger reaction interface. Although it has not previously been possible to make the surface area of the reaction interface large enough, in the electron transporting layer 3 and the hole transporting layer 4 of the above-described photoelectric element, because organic compounds having redox moieties are with the electrolyte solution to form the gel layers 6 and 7, the reaction interface between the redox moieties and the electrolyte solution that has permeated the gel layers 6 and 7 becomes larger, enabling the exchange efficiency to be increased.

There are two conceivable reasons why the reaction interface becomes larger. The first reason is that in an electron transporting material composed of a conventional inorganic semiconductor, because the material is inorganic, even when rendered into fine particles, it is difficult to reduce it below a nanometer scale. By contrast, in the above-described electron transporting layer 3 and hole transporting layer 4, so long as the redox moieties are in a state where they oxidize or reduce and can transport electrons, the structure is compartmentalized at the molecular level, as a result of which the surface area of the interface required for charge separation appears to increase. Interfacial formation on an angstrom scale is theoretically possible, particularly in cases where the electron transporting layer 3 and the hole transporting layer 4 are formed of a high-molecular-weight organic compound. The second conceivable reason is the possibility that a special interfacial state forms so as to promote charge separation at the interface between the redox moieties of the organic compound and another layer, the electrolyte solution or the like.

Because the electron transporting layer 3 and the hole transporting layer 4 are formed of organic compounds having redox moieties, design and synthesis in accordance with electrical characteristics such as the potential and with structural characteristics such as molecular size is easy, in addition to which control of the gelation and solubility of the electron transporting layer 3 and the hole transporting layer is possible. Also, the fact that electron transporting layer 3 and the hole transporting layer 4 are formed of organic compounds obviates the need for high-temperature firing such as that employed in the formation of an electron transporting material layer from an inorganic semiconductor or other inorganic material, which is advantageous in terms of the production process, in addition to which flexibility can be conferred to these layers. Moreover, with organic compounds, unlike with inorganic materials and precious metal materials, resource depletion is not a problem, the toxicity is low and, when the photoelectric element is ultimately discarded, thermal energy can be recovered by hot incineration.

In addition, because, as described above, an electrolyte solution is contained in (permeates) the organic compound making up the electron transporting layer, the redox state of the redox moieties present within the organic compound is stabilized, and electrons are more stably transported. That is, compared with the inorganic compounds such as metal semiconductors and metal oxide semiconductors which are commonly used as the electron transporting material, organic compounds are thought to be difficult to use as the materials in the electron transporting layer 3 and the hole transporting layer 4 on account of the instability of the redox state (oxidized state or reduced state). However, by employing a structure in which the organic compound contains an electrolyte solution (by having an electrolyte solution permeate the organic compound), the ionic state which forms on account of the redox reactions at the redox moieties is charge compensated by counterions within the electrolyte solution. Thus, for example, the redox moieties which have entered into a cationic state are stabilized by the opposite charges of anions within the electrolyte solution. In addition, the reduced state of the redox moieties is stabilized by such effects as solvation by the solvent and the dipole moment of the solvent, as a result of which the redox moieties are stabilized. Also, because the electrolyte solution is held by gel layers 6 and 7, fluid leakage does not arise in the photoelectric element.

Hence, by employing photoelectric elements formed by disposing an electron transporting layer and a hole transporting layer between a pair of electrodes, it is possible to fabricate devices composed of photoelectric elements, including devices which generate power by photoelectric conversion, such as photoelectric cells and solar cells; luminescent devices such as organic EL devices; optical display devices such as electrochromic display devices and electronic paper; and sensor elements which are sensitive to temperature, light and the like.

The invention is not limited to the above embodiments, suitable design modifications and other changes being possible without departing from the objects and scope of the invention.

EXAMPLES

The invention is illustrated more fully below by way of examples.

Example 1

Synthesis of TEMPO-Substituted Norbornene Monomer

After dissolving 2.0 g (12.2 mmol) of 5-norbornene-2,3-carboxylic anhydride in 180 mL of benzene, 4.2 g (24.4 mmol) of 4-hydroxy-TEMPO, 2.4 mL (17.2 mmol) of triethylamine (TEA) and 0.63 g (5.15 mmol) of 4-dimethylaminopyridine (DMAP) were added, and stirring under refluxing was carried out for 12 hours. The system was allowed to cool, following which 3.9 g (15.2 mmol) of 2-chloro-1-methylpyridinium iodide was added and reaction was carried out at room temperature for 12 hours. Following the reaction, the precipitate was filtered off, the filtrate was extracted with ether and rinsed with water, after which the solvent was removed. The residue thus obtained was column purified with silica gel using chloroform/hexane/ethyl acetate (volumetric mixing ratio, 6/3/1) as the developing solvent, then re-crystallized from hexane/dichloromethane (volumetric mixing ratio, 8/2), giving the TEMPO-substituted norbornene monomer of Formula 33 below as orange crystals (yield, 40%).

Formula 33

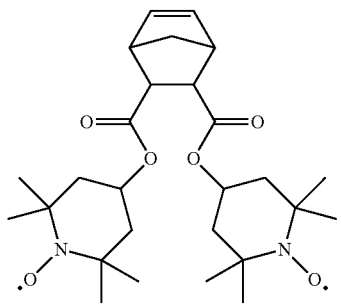

(Synthesis of TEMPO-Substituted Norbornene Polymer (Homopolymer))

The TEMPO-substituted norbornene (100 mg, 0.20 mmol) was dissolved in 1.0 mL of toluene within a 10 mL Nasu flask. It should be noted that the monomer (TEMPO-substituted norbornene monomer) shown in Formula 33 is composed of two isomers—an endo-endo derivative and an endo-exo derivative, and is used as the mixture in polymerization. A second generation Grubbs catalyst (2.3 mg, 0.00270 mmol) was added to this solution, and the system was stirred for 12 hours at 40° C. in an argon atmosphere. The system was then brought to room temperature, following which purification by reprecipitation was carried out using 200 mL of diethyl ether. The light-orange powder that formed was collected on a glass filter G4, and vacuum dried at 50° C. for 10 hours, thereby giving a TEMPO-substituted norbornene polymer composed of the recurring units shown in Formula 34 below. The molecular weight of the resulting TEMPO-substituted norbornene polymer was measured by gel permeation chromatography (GPC) (with a TSKgel GMHXL column from Tosoh Corporation) using chloroform as the eluant, as a result of which the number-average molecular weight was 30,000 (polystyrene equivalent) and the polydispersity (weight-average molecular weight/number-average molecular weight) was 1.2.

Formula 34

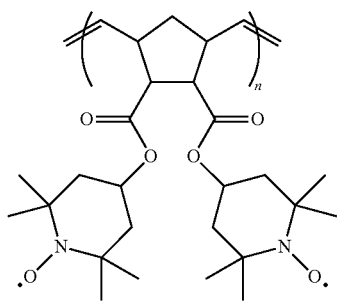

(Formation of Hole Transporting Layer)

A conductive glass substrate having a thickness of 0.7 mm and a sheet resistivity of 100Ω/□ was furnished as the base material 8 on which the second electrode 5 has been provided. In this conductive glass substrate, which was composed of a glass substrate and a coating film of fluorine-doped $SnO_2$ that had been deposited on one side of the glass substrate, with the glass substrate serving as the base material 8 and the coating film serving as the second electrode 5.

The above TEMPO-substituted norbornene polymer (19.8 mg), 0.66 mL of ethyl lactate and 1.98 mg of the bis(azido) derivative shown in Formula 35 were dissolved in 0.132 mL of chloroform. This solution was spin-coated onto the above conductive glass substrate to a film thickness of 100 nm. The film was dried at 60° C. for 15 minutes, then UV-irradiated for 60 seconds, thereby crosslinking the TEMPO-substituted norbornene polymer and forming a hole transporting layer 4 composed of poly(TEMPO-substituted norbornene) (PTNB).

Formula 35

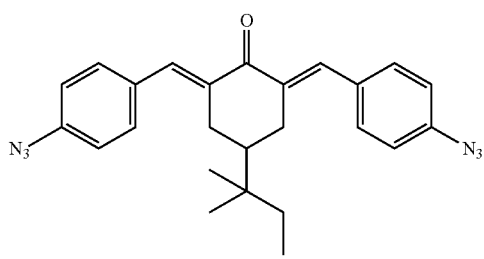

(Dye Supporting Method)

Next, transparent conductive glass on which a hole transporting layer 4 had been provided was immersed for 1 hour in an acetonitrile saturated solution of the sensitizing dye (D131) shown in Formula 36. The glass was then rinsed with acetonitrile for 5 minutes to remove residual dye.

Formula 36

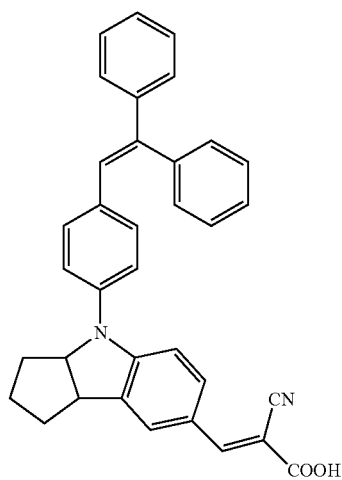

(Device Fabrication)

A conductive glass substrate having the same structure as the conductive glass substrate used to form the hole transporting layer 4 was furnished as a base material 1 on which an electrode 2 had been provided.

An isopropyl alcohol solution containing 5 mM of dissolved chloroplatinic acid was spin-coated onto the above-described conductive glass substrate, then baked at 400° C. for 30 minutes.

Next, the conductive glass substrate on which the hole transporting layer 4 had been provided and the chloroplatinic acid-treated conductive glass substrate were arranged with the hole transporting layer 4 and the chloroplatinic acid-treated side facing each other, and a heat-meltable adhesive (Bynel, from E.I. DuPont de Nemours & Co.) was interposed to a width of 1 mm and a thickness of 50 μm between the two along the periphery thereof. While heating this heat-meltable adhesive, pressure was applied to the two conductive glass substrates in the thickness direction, thereby bonding together the two conductive glass substrates by means of the heat-meltable adhesive. Openings intended to serve as electrolyte injection ports were formed in the heat-meltable adhesive. Electrolyte solution was then filled between the hole transporting layer 4 and the chloroplatinic acid-treated conductive glass substrate via the injection ports. Next, a UV-curable resin was applied to the injection ports, following which UV light was irradiated, thereby curing the UV-curable resin and plugging the injection ports. In this way, along with forming an electron transporting layer 3 composed of an electrolyte solution, this electrolyte solution was made to permeate the hole transporting layer 4, causing the PTNB making up the hole transporting layer 4 to be swollen to form a gel layer 6. An aqueous solution containing the methyl viologen shown in Formula 19 and potassium chloride in respective concentrations of 0.02 M and 1 M was used as the electrolyte solution. This process resulted in the fabrication of a photoelectric element.

Example 2

Method of Synthesizing Nitroxyamide

A nitroxyamide was synthesized by the reaction scheme shown in Formula 37 below. Specifically, 2.8 mL (16 mmol) of 4-amino-2,2,6,6-tetramethylpiperidine was added to 60 mL of benzene, cooled to 0° C. and stirred, following which 1.3 mL (16 mmol) of acryloyl chloride was added in a dropwise manner. The system was then cooled at 0° C. for 1 hour, and subsequently stirred overnight at room temperature, causing crystals to settle out. Solvent removal was then carried out, followed by purification by recrystallization, giving Product 2 in the reaction scheme shown in Formula 37 at a yield of 54%.

Next, 105 mg of Product 2 thus obtained was dissolved in 1 mL of methanol, 1.64 mg of azobisisobutyronitrile (AIBM) was added under a nitrogen atmosphere, and the system was stirred overnight at 85° C., causing crystals to settle out. Solvent removal was then carried out, followed by purification by recrystallization, giving Product 3 in the scheme in Formula 37.

In addition, 150 mg of Product 3 was dissolved in 5.0 mL of tetrahydrofuran (THF), 1.23 g of 3-chloroperoxybenzoic acid (mCPBA) was added under a nitrogen atmosphere, and the system was stirred overnight at 85° C. The resulting crystals were subjected to solvent removal, then purified by recrystallization, giving Product 4 (nitroxyamide) in the scheme in Formula 37. The molecular weight of this polymer was 3,000.

Formula 37

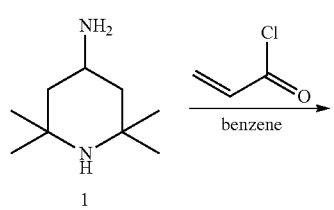

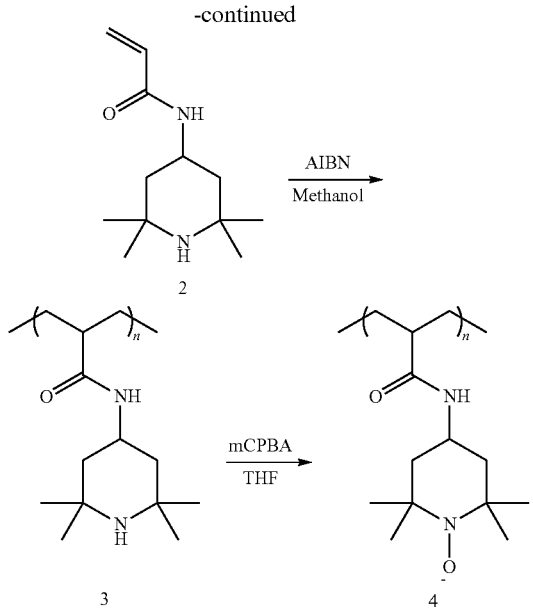

(Formation of Hole Transporting Layer)

The nitroxyamide (10 mg) was dissolved in 1 mL of tetrahydrofuran (THF), and the solution was drop-cast onto a conductive glass substrate to form a film having a thickness of 100 nm.

(Dye Supporting Method and Device Fabrication)

Support of a dye on the hole transporting layer 4 and fabrication of a photoelectric element were subsequently carried out by the same methods as in Example 1.

Example 3

An acetonitrile solution containing 0.01 M of the galvinohydroxyl radical shown in Formula 18, 0.0025 M of N-methylbenzimidazole and 0.01 M of lithium perchlorate was used as the electrolytic solution. Aside from this, a photoelectric device was fabricated under the same conditions as in Example 1.

Example 4

In the formation of the hole transporting layer and in the support of the dye in Example 1, 10 mg of nitroxyamide and 3 mg of sensitizing dye (D131) were dissolved in 1 mL of tetrahydrofuran (TFH), and the resulting solution was drop-cast onto a conductive glass substrate. In this way, a 100 nm thick hole transporting layer which supports a sensitizing dye was formed.

Aside from this, a photoelectric element was fabricated under the same conditions as in Example 1.

Example 5

In hole transporting layer formation and in dye support in Example 1, first 10 mg of nitroxyamide was dissolved in 1 mL of tetrahydrofuran (THF) and the resulting solution was drop-cast onto a conductive glass substrate, thereby forming a hole transporting layer having a thickness of 100 nm. Next, a saturated acetonitrile solution of the sensitizing dye (D131) was spin-coated onto the hole transporting layer, thereby supporting the sensitizing dye on the hole transporting layer.

Aside from this, a photoelectric element was fabricated under the same conditions as in Example 1.

Comparative Example 1

Fullerene (C60) was vapor-deposited onto a transparent conductive glass substrate like that in Example 1 to form an electron transporting layer 3 having a thickness of 10 nm.

Next, the transparent conductive glass on which the electron transporting layer 3 had been provided was immersed for 1 hour in a saturated acetonitrile solution of the sensitizing dye (D131). This was subsequently rinsed with acetonitrile for 5 minutes to remove excess dye.

In addition, an isopropyl alcohol solution in which 5 mM of chloroplatinic acid had been dissolved was spin-coated onto another transparent glass substrate 1, then baked at 400° C. for 30 minutes.

Next, the conductive glass substrate on which the electron transporting layer 3 had been provided and the chloroplatinic acid-treated conductive glass substrate were arranged with the electron transporting layer 3 and the chloroplatinic acid-treated side facing each other, and a heat-meltable adhesive (Bynel, from E.I. DuPont de Nemours & Co.) was interposed to a width of 1 mm and a thickness of 50 μm between the two along the periphery thereof. While heating this heat-meltable adhesive, pressure was applied to the two conductive glass substrates in the thickness direction, thereby bonding together the two conductive glass substrates by means of the heat-meltable adhesive. Openings intended to serve as electrolyte injection ports were formed in the heat-meltable adhesive. Electrolyte solution was then filled between the electron transporting layer 3 and the chloroplatinic acid-treated conductive glass substrate via the injection ports. Next, a UV-curable resin was applied to the injection ports, following which UV light was irradiated, thereby curing the UV-curable resin and plugging the injection ports. An aqueous solution containing 0.02 M of methyl viologen and 1 M of potassium chloride was used as the electrolytic solution. This process resulted in the fabrication of a photoelectric element.

[Evaluation Tests]

The open circuit voltage and short circuit current values of the photoelectric elements obtained in the respective examples of the invention and the comparative example were measured by IV measurement using a Keithley 2400 SourceMeter (model 2400 general-purpose source meter from Keithley Instrument) while irradiating a region of the photoelectric element having a top-view surface area of 1 cm$^2$ with 200 lux of light. Measurement was carried out in a 25° C. environment using a fluorescent lamp (rapid fluorescent lamp FLR 20S•W/M, from Panasonic Corporation) as the light source. In addition, the photoelectric element was evaluated under conditions where a photoelectric conversion area of 1 cm$^2$ received light. Those results are shown in Table 1 below.

TABLE 1

|  | Open circuit voltage | Short circuit current |
|---|---|---|
| Example 1 | 500 mV | 1.1 μA/cm$^2$ |
| Example 2 | 550 mV | 0.9 μA/cm$^2$ |
| Example 3 | 450 mV | 0.8 μA/cm$^2$ |
| Example 4 | 460 mV | 1.2 μA/cm$^2$ |
| Example 5 | 520 mV | 0.8 μA/cm$^2$ |
| Comparative Example 1 | 100 mV | <10 nA/cm$^2$ |

[Power Storage Characteristics]

The power storage characteristics of the photoelectric elements obtained in Example 1 and Comparative Example 1 were evaluated.

Each of the photoelectric elements was irradiated with 200 lux light for 300 seconds (5 minutes), and the open circuit voltage of the photoelectric element was measured using a Keithley 2400 SourceMeter (a model 2400 general-purpose source meter from Keithley Instruments). Next, each of the photoelectric elements was placed for 300 seconds (5 minutes) in a light-shielding vessel, and the open circuit voltage of the photoelectric element was measured by the same method as above.

Figure 3:
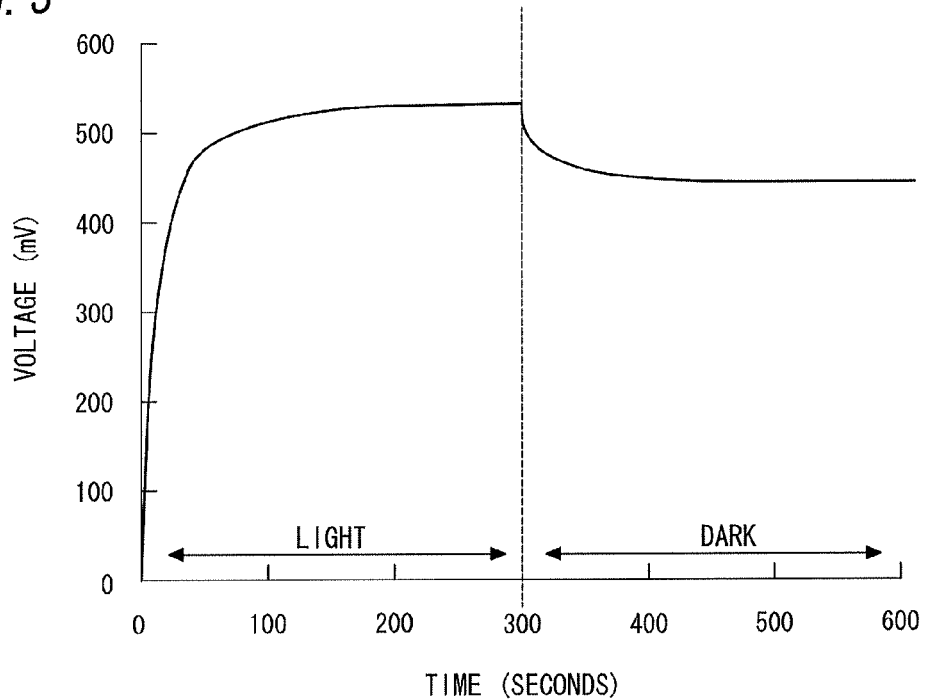
FIG. 3 is a graph showing the results from measurements of the change in the open circuit voltage when the photoelectric element obtained in Example 1 was irradiated with light, then shielded from light.
Figure 4:
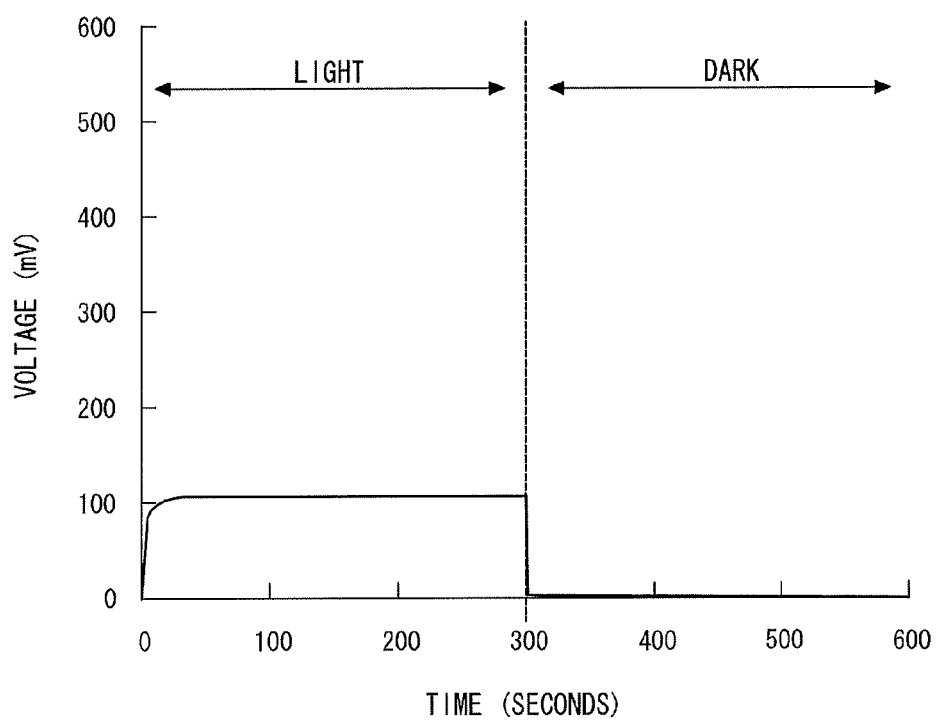
FIG. 4 is a graph showing the results from measurements of the change in the open circuit voltage when the photoelectric element obtained in Comparative Example 1 was irradiated with light, then shielded from light.

The open circuit voltage measurement results for Example 1 are shown in FIG. 3, and the open circuit voltage measurement results for Comparative Example 1 are shown in FIG. 4.

From these results, the open circuit voltage maintenance in Example 1 was at least 70%, indicating a high power storage ability. By contrast, in Comparative Example 1, the open circuit voltage maintenance was less than 1%.

In the following examples according to the invention, the second gel layer 6 composed of the electron transporting layer 3 was an n-gel, and the first gel layer 7 composed of the hole transporting layer 4 was a p-gel.

Example 6

Synthesis of Poly(Decyl Viologen) (PV10)

4,4'-bipyridine (1.008 g, 6.46×10$^{-3}$ mol) and 1,10-dibromodecane (1.938 g, 6.46×10$^{-3}$ mol) were added to a 20 mL Nasu flask and completely dissolved by stirring in 10 mL of CH$_3$OH-DMF (=50:50 vol %). The resulting solution was stirred at 60° C. for 54 hours, whereupon a light-yellow precipitate began to settle out. On stirring this solution for another 12 hours, substantially all of the solvent vanished and a solvent-containing light-yellow precipitate settled out. This light-yellow precipitate was rinsed with acetonitrile and chloroform, filtered using a glass filter, then vacuum-dried under applied heat to remove the solvent, thereby giving PV10 (1.95 g; yield, 65%) in the form of a light-yellow powder. Measurement of the structure of this PV10 by NMR showed the degree of polymerization to be 10 and the molecular weight to be about 3,200, thereby enabling the product to be identified as PV10.

The molecular weight was the number-average molecular weight. Measurement of the molecular weight can be carried out by gel permeation chromatography. The same applies to the molecular weight and measurement thereof for other polymers below.

(Synthesis of PV10-PSS)

Next, a PV10-PSS complex was synthesized by the following method.

While stirring an aqueous solution of polystyrene sulfonic acid (PSS) (0.2 M, 10 mL, 2 mmol), an aqueous solution of PV10 (0.1 M, 10 mL, 1 mmol) was slowly added thereto in a dropwise manner using a Pasteur pipette. The concentration is the value calculated from the molecular weight per unit of polymer. Upon the dropwise addition of an aqueous solution of PV10 in this way, a light-yellow precipitate formed in the solution. The light-yellow precipitate was vacuum dried overnight at 50° C., giving a PV10-PSS complex in the form of a yellow solid. PV10-PSS is used to facilitate film formation of the PV10.

(Formation of Electron Transporting Layer: PV10 Film Formation)

Using an FTO substrate as the substrate (first base material 1 and first electrode 2), a 5 wt % aqueous solution of the PV10-PSS complex (poly(decyl viologen)-polystyrene sulfonic acid) was spin-coated onto the FTO substrate at 1,000 rpm, thereby forming a film having a thickness of 100 nm (first film).

A 5 wt % aqueous solution of PV10 was spin-coated at 6,000 rpm onto the first film, thereby depositing a 40 nm thick film (second film). The first film and the second film were immersed for 1 hour in a saturated acetonitrile solution of the sensitizing dye D131 shown in Formula 36, following which they were rinsed for 5 minutes with acetonitrile to remove excess dye, thereby producing a third film (a film obtained by supporting the dye D131 on the first film and the second film).
(Synthesis of PTNB)

A norbornene-based crosslinked copolymer (PTNB) was synthesized by the following method. Norbornene-based crosslinked copolymers and methods of synthesis are disclosed in Japanese Patent Application Laid-open No. 2007-070384. Synthesis may be carried out by those methods.
Synthesis of TEMPO-Substituted Norbornene Monomer 5-norbornene-2,3-carboxylic anhydride (2.0 g, 12.2 mmol) was dissolved in 180 mL of benzene, following which 4.2 g (24.4 mmol) of 4-hydroxy-TEMPO, 2.4 mL (17.2 mmol) of triethylamine (TEA) and 0.63 g (5.15 mmol) of 4-dimethylaminopyridine (DMAP) were added to the solution and stirred under refluxing for 12 hours. After cooling, 3.9 g (15.2 mmol) of 2-chloro-1-methylpyridinium iodide was added to this solution and the reaction was carried out at room temperature for 12 hours. Following the reaction, the precipitate was filtered off and the filtrate was extracted with ether and rinsed with water, following which the solvent was removed. The residue thus obtained was column purified with silica gel using chloroform/hexane/ethyl acetate (volumetric mixing ratio, 6/3/1) as the developing solvent, then recrystallized from hexane/dichloromethane (volumetric mixing ratio, 8/2), thereby giving orange crystals of the TEMPO-substituted norbornene monomer shown in Formula 33 (yield, 40%).
Synthesis of Difunctional Monomer 2,5-norbornadiene (2.6 g, 28.2 mmol) and p-diiodobenzene (1.5 g, 4.55 mmol) were dissolved in 5 mL of N,N-dimethylformamide (DMF). To the resulting solution were added 2.3 g (27.0 mmol) of piperidine as a base, 100 mg (0.45 mmol) of palladium acetate, and 0.36 g (1.37 mmol) triphenylphosphine as a ligand in an argon atmosphere, following which the solution was stirred. Formic acid (1.1 g, 23.9 mmol) was added at a time to this reaction solution by syringe, and reacted at 60° C. for 4 hours. In this reaction, a white mist vigorously arose due to neutralization. Following the reaction, extraction with ethyl acetate and rinsing with water were carried out, after which the solvent was removed. The residue thus obtained was column purified (Rf=0.45; eluant: hexane) with silica gel using an ethyl acetate/hexane (volumetric mixing ratio, 3/1) mixed solvent, thereby giving the difunctional monomer (1,4-bisnorbornenyl benzene) as a colorless solid (yield, 35%).
Copolymerization of Monomer Next, 100 mg (0.20 mmol) of the TEMPO-substituted norbornene monomer synthesized above was dissolved in 1.0 mL of dichloromethane within a 10 mL Nasu flask. To this were added 1.5 mg (0.00571 mmol) of the difunctional monomer synthesized above (1,4-bisnorbornenyl benzene) and 2.3 mg (0.00270 mmol) of second generation Grubbs catalyst, and stirring was carried out under an argon atmosphere at 40° C. for 12 hours. The above monomer (TEMPO-substituted norbornene monomer) is composed of two isomers—the endo-endo derivative and the endo-exo derivative, but is used as the mixture in polymerization.

Following polymerization, the reaction mixture was set to room temperature and purified by re-precipitation using 200 mL of diethyl ether, the light-orange powder thereby obtained was collected by filtration with a glass filter G4, and the light-orange powder was vacuum dried at 50° C. for 10 hours. In this way, 87 mg of a TEMPO-substituted norbornene monomer-difunctional monomer copolymer (PTNB) having a crosslinked structure was obtained. The molecular weight of this polymer was 8,000.
(Formation of Hole Transporting Layer: PTNB Film Formation)

The above PTNB (19.8 mg), 0.66 mL of ethyl lactate and 1.98 mg of a crosslinking agent (BACTC) were dissolved in 0.132 mL of chloroform. The solution thus obtained was drop-cast onto a dye-supporting PV10 film (third film) and formed as a film having a thickness of 100 nm.

Next, by irradiating the above film with ultraviolet light for 60 seconds, the PTNB was crosslinked, forming a PTNB film.
(Device Fabrication)

Gold was vapor deposited to a film thickness of 10 nm on the above PTNB film.

Another conductive glass substrate (FTO substrate) separate from the above substrate was furnished. A solution obtained by dissolving chloroplatinic acid to a concentration of 5 mM in isopropyl alcohol was spin-coated onto the coating film of this substrate, then fired at 400° C. for 30 minutes, forming an accompanying second electrode 5.

Next, the above conductive glass substrate (the substrate on which the electron transporting layer 3 and the hole transporting layer 4 were stacked) and the above other conductive glass substrate on which the second electrode 5 was formed were arranged with the sides to be stacked together on the inside, and heat-meltable adhesive (Bynel, from E.I. DuPont de Nemours & Co.) was interposed to a width of 1 mm and a thickness of 50 μm between the two along the periphery thereof. While heating this heat-meltable adhesive, pressure was applied to the two conductive glass substrates in the thickness direction, thereby bonding together the two conductive glass substrates by means of the heat-meltable adhesive. The heat-meltable adhesive was arranged beforehand so as to leave therein openings intended to serve as injection ports for the electrolyte solution.

Next electrolyte was added via the injection ports. The electrolyte used was an acetonitrile solution containing 0.5 M of LiTFSI and 1.6 M of N-methylbenzimidazole.

A UV-curable resin was then applied to the electrolyte injection ports, following which UV light was irradiated, thereby curing the UV-curable resin and plugging the injection ports.

This process resulted in the fabrication of a photoelectric element.

Example 7

Synthesis of Nitroxyamide

The nitroxyamide was synthesized by the scheme shown in Formula 37.

First, 60 mL of benzene was added to 2.8 mL (16 mmol) of 4-amino-2,2,6,6-tetramethylpiperidine, the system was cooled to 0° C. and stirred. Next, 1.3 mL (16 mmol) of acryloyl chloride was added in a dropwise manner and the system was cooled at 0° C. for 1 hour, following which it was stirred overnight at room temperature, causing crystals to settle out. Solvent removal was then carried out, followed by purification by recrystallization, giving Product (2) in the scheme at a yield of 54%.

The product (2) (105 mg) obtained above was dissolved in 1 mL of methanol, 1.64 mg of azobisisobutyronitrile (AIBM) was added in a nitrogen atmosphere, and stirring was carried out overnight at 85° C., causing crystals to settle out. Solvent removal was then carried out, followed by purification by recrystallization, giving Product (3) in the scheme.

In addition, 150 mg of this product (3) was dissolved in 5.0 mL of tetrahydrofuran (THF), then 1.23 g of 3-chloroperoxybenzoic acid (mCPBA) was added under a nitrogen atmosphere, and the system was stirred overnight at 85° C. Solvent removal was carried out, following which the resulting crystals were purified by recrystallization, giving Product (4) in the scheme. The molecular weight of this polymer was 3,000.
(Formation of Hole Transporting Layer: Film Formation of Nitroxyamide)

A PV10 film (Film C) was formed using the same materials and method as in Example 6.

Next, 19.8 mg of the above nitroxyamide was dissolved in 0.66 mL of ethyl lactate, and the solution was drop-cast onto the PV10 film (Film C) supporting the dye, thereby forming a film having a thickness of 100 nm.
(Device Fabrication)

Aside from using the above nitroxyamide film instead of a PTNB film, a photoelectric element was fabricated using the same materials and method as in Example 6.

Example 8

Synthesis of Galvi Monomer

A galvi monomer and a galvi polymer were synthesized according to the scheme (procedure) shown in Formula 38.

4-bromo-2,6-di-tert-butyl phenol (135.8 g, 0.476 mol) and acetonitrile (270 mL) were placed in a reactor, in addition to which N,O-bis(trimethylsilyl)acetamide (BSA) (106.3 g, 129.6 mL) was added under an inert atmosphere and the system was stirred overnight at 70° C. to effect a reaction until the crystals settled out completely. The white crystals that settled out were filtered and vacuum dried, then purified by recrystallization from ethanol, yielding white plate-like crystals of (4-bromo-2,6-di-tert-butylphenoxy)trimethylsilane (150.0 g, 0.420 mol) shown as Product (1) in the scheme.

Next, within a reactor, the above (4-bromo-2,6-di-tert-butylphenoxy)trimethylsilane (9.83 g, 0.0275 mol) was dissolved in tetrahydrofuran (200 mL) under an inert atmosphere, and the solution was cooled to −78° C. using dry ice/methanol. To the solution within this reactor was added a 1.58 M n-butyllithium/hexane solution (15.8 mL, 0.025 mol), and ionization was carried out by stirring at 78° C. for 30 minutes. Next, a tetrahydrofuran (75 mL) solution of methyl 4-bromobenzoate (1.08 g, 0.005 mol; mw, 215.0; TCI) was added to this solution, following which stirring was carried out overnight at from −78° C. to room temperature. In this way, the solution changed from a yellow to a light-yellow color, then to a deep blue color indicating the generation of anions. Following the reaction, a saturated aqueous solution of ammonium chloride was added to the solution within the reactor until the color of the solution became completely yellow, following which this solution was subjected to liquid separation and extraction with ether/water, yielding a product in the form of a viscous yellow liquid.

Next, the above product, THF (10 mL), methanol (7.5 mL) and a stirrer were placed in a reactor and dissolution was carried out, following which 10N—HCl (1 to 2 mL) was gradually added until the solution within the reactor changed to a red-orange color, and the reactor contents were stirred for 30 minutes at room temperature. Next, purification was carried out by the respective operations of solvent removal, liquid separation and extraction with ether/water, solvent removal, fractionation by column chromatography (hexane/chloroform=1/1), and recrystallization from hexane, giving orange crystals of (p-bromophenyl)hydrogavinoxyl (2.86 g, 0.0049 mol) shown as Product (2) in the scheme.

Next, the above (p-bromophenyl)hydrogalvinoxyl (2.50 g, 4.33 mmol) was dissolved in toluene (21.6 mL, 0.2 M) within a reactor under an inert atmosphere, then 2,6-di-tert-butyl-p-cresol (4.76 mg, 0.0216 mmol), tetrakis(triphenylphosphine)palladium (0) (0.150 g, 0.130 mmol) and tri-n-butylvinyltin (1.65 g, 5.20 mmol; Mw, 317.1; TCI) were rapidly added to this solution, and the system was stirred under heating at 100° C. for 17 hours.

The reaction product thus obtained was purified by liquid separation and extraction with ether/water and solvent removal, followed by fractionation by flash column chromatography (hexane/chloroform=1/3), and recrystallization from hexane, thereby giving fine orange crystals of p-hydrogalvinoxyl styrene (1.54 g, 2.93 mmol) shown as Product (3) in the scheme.
(Polymerization of Galvi Monomer)

One gram of the galvi monomer (p-hydrogalvinoxyl styrene) obtained in the above synthesis, 57.7 mg of tetraethylene glycol diacrylate and 15.1 mg of azobisisobutyronitrile were dissolved in 2 mL of tetrahydrofuran, following which the system was flushed with nitrogen and refluxed overnight to polymerize the galvi monomer, thereby giving the galvi polymer shown as Product (4) in the scheme. The molecular weight of the galvi polymer was 10,000.

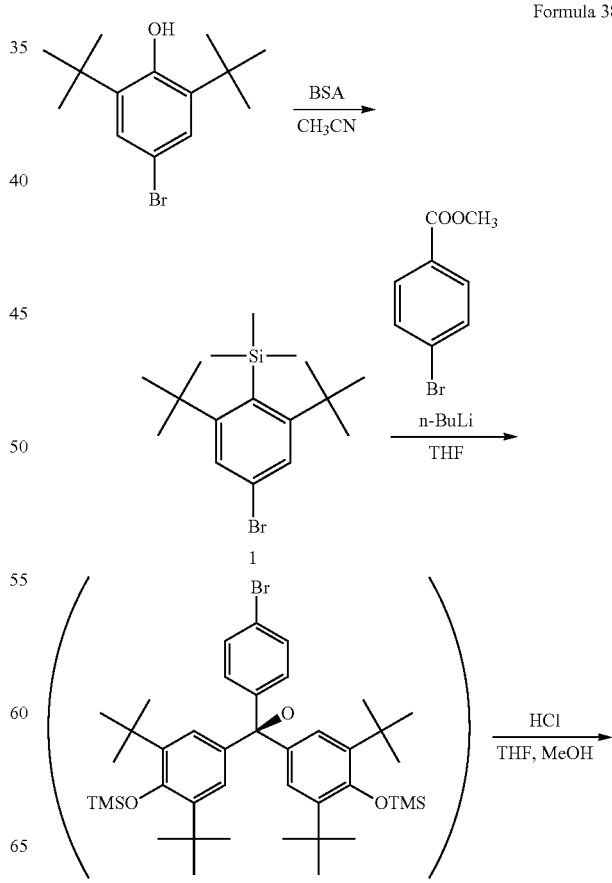

Formula 38

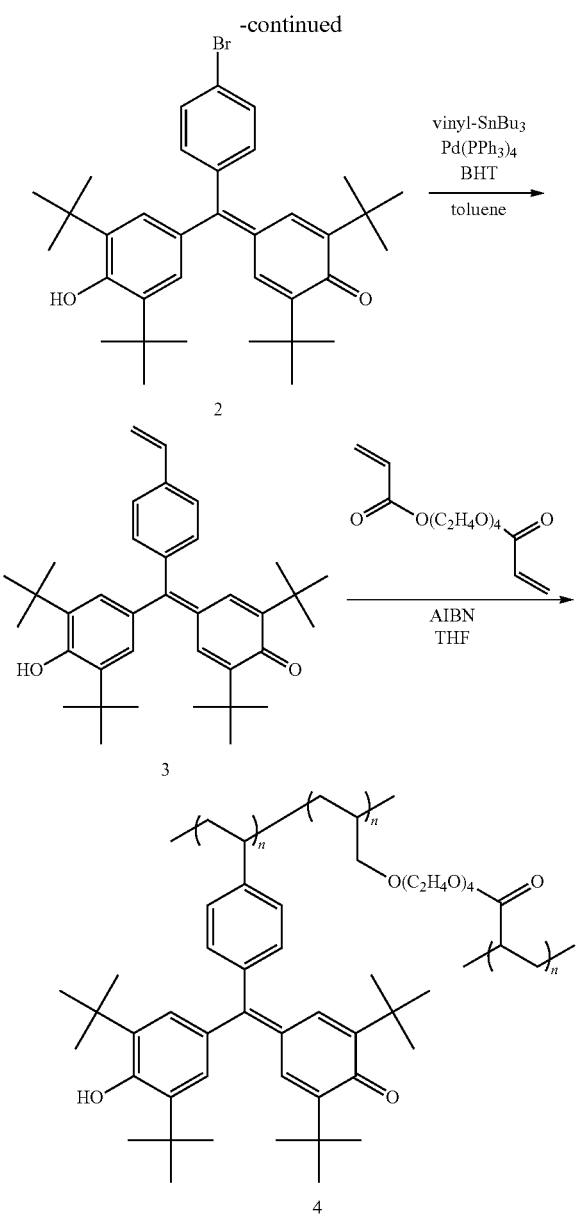

(Formation of Electron Transporting Layer: Galvi Polymer Film Formation)

A conductive glass substrate having a thickness of 0.7 mm and a sheet resistivity of $100\Omega/\square$ was prepared as the base material 1 on which a electrode 2 was provided. This conductive glass substrate was composed of a glass substrate and a coating film of fluorine-doped $SnO_2$ that had been deposited on one side of the glass substrate, with the glass substrate serving as the first base material 1 and the coating film serving as the first electrode 2.

The above galvi polymer (Product (4) in the scheme) was dissolved in a proportion of 2 wt % in chlorobenzene. This solution was spin-coated at 2,000 rpm onto the electrode 2 of the conductive glass substrate, and dried at 60° C. and 0.01 MPa for 1 hour, thereby forming a galvi polymer film (electron transporting layer 3) having a thickness of 60 nm.

This galvi polymer film was immersed for 1 hour in a saturated acetonitrile solution of a sensitizing dye (D131).

(Fabrication of Device)

PTNB was formed into a film on the surface of the galvi polymer film by the same method as in Example 6, and irradiated with UV light, thereby forming a hole transporting layer 4.

Aside from using the galvi film instead of a PV10 film, a photoelectric element was then fabricated using the same materials and method as in Example 6.

Example 9

Synthesis of Quinone Polymer

The quinone polymer shown in Formula 25 was synthesized by the reaction shown in Formula 39.

First, a 10 mL Nasu flask was charged with 50 mg (0.172 mmol, 1 eq) of 1-methacrylamide anthraquinone, 25 μL (0.172 mmol, 1 eq) of divinylbenzene and 0.48 g (3.43 μmol, 0.02 eq) of AIBN (azobisisobutyronitrile) under an argon atmosphere, and these were dissolved in 1.72 mL of THF, following which oxygen present in dissolution within the solvent was removed with argon. Deaeration was then carried out, after which the reaction was effected at 70° C. for 48 hours. Following reaction completion, precipitate was formed with methanol and Soxhlet washed with THF, giving 37.3 mg of a polymer in the form of a yellow solid. The molecular weight of this polymer was 4,000.

Formula 39

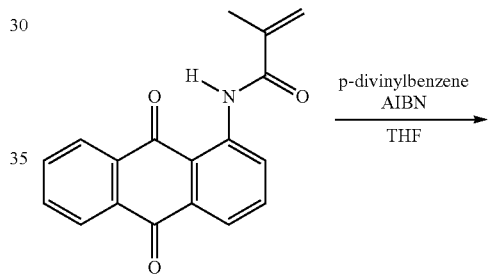

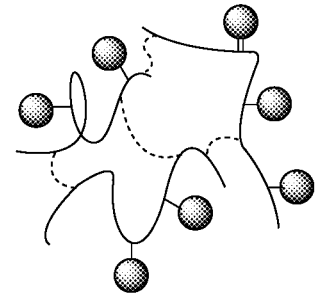

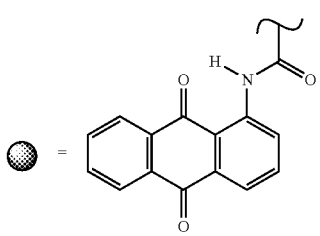

(Formation of Electron Transporting Layer: Film Formation of Quinone Polymer)

Using an FTO substrate as the substrate (first base material 1 and first electrode 2), 10 mg of the above polymer was dissolved in 0.1 g of N-methylpyrrolidone, then spin-coated at 1,000 rpm onto the FTO substrate to form a film having a thickness of 100 nm.

This quinone polymer film was immersed for 1 hour in a saturated acetonitrile solution of D131, thereby carrying out dye supporting treatment.

(Device Fabrication)

PTNB was formed as a film on the surface of the quinone polymer film by the same method as in Example 6, then irradiated with UV light, forming a hole transporting layer 4.

Next, aside from using a quinone polymer film instead of a PV10 film, a photoelectric element was fabricated using the same materials and method as in Example 6.

Example 10

Formation of Electron Transporting Layer

An electron transporting layer 3 was formed by the same method as in Example 6. That is, PV10 (poly(decyl viologen)) and a PV10-PSS complex were synthesized and these were formed as a film on an FTO substrate, then D131 support was carried out, thereby forming an electron transporting layer 3.

(Formation of Hole Transporting Layer)

A norbornene-based crosslinked copolymer (PTNB) was synthesized by the same method as in Example 6.

Then, using as the substrate (first base material 1 and first electrode 2) another conductive glass substrate (FTO substrate) other than the substrate on which a film of PV10 had been formed, a solution obtained by dissolving 19.8 mg of PTNB, 0.66 mL of ethyl lactate and 1.98 mg of a crosslinking agent (BACTC) dissolved in 0.132 mL of chloroform was drop-cast onto this substrate, forming a film to a thickness of 100 nm.

Next, the PTNB was crosslinked by irradiating the above film with UV light for 60 seconds.

This film was then immersed for 1 hour in a saturated acetonitrile solution of D131, following which it was rinsed with acetonitrile for 5 minutes to remove excess dye.

(Device Fabrication)

The conductive glass substrate provided with D131-supporting PV10 (substrate on which electron transporting layer 3 was formed) and the conductive glass substrate provided with D131-supporting PTNB (substrate on which the hole transporting layer 4 was formed) were arranged so that the PV10 layer and the PTNB layer faced each other, and heat-meltable adhesive (Bynel, from E.I. DuPont de Nemours & Co.) was interposed to a width of 1 mm and a thickness of 50 μm between the two along the periphery thereof. While heating this heat-meltable adhesive, pressure was applied to the two conductive glass substrates in the thickness direction, thereby bonding together the two conductive glass substrates by means of the heat-meltable adhesive. The heat-meltable adhesive was arranged beforehand so as to leave therein openings intended to serve as injection ports for the electrolyte solution.

Electrolyte solution was then added via the injection ports. The electrolyte solution used was an aqueous solution containing 0.1 M of methyl viologen, 0.01 M of the compound having the chemical formula in Formula 40, and 0.1 M of LiClO$_4$.

Next, a UV-curable resin was applied to the electrolyte injection ports, following which UV light was irradiated, thereby curing the UV-curable resin and plugging the injection ports.

This process resulted in the fabrication of a photoelectric element.

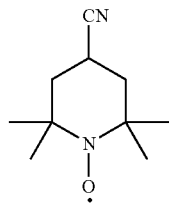

Formula 40

Example 11

Formation of Electron Transporting Layer

An electron transporting layer 3 was formed by the same method as in Example 6. That is, PV10 (poly(decyl viologen)) and a PV10-PSS complex were synthesized, these were formed into a film on the FTO substrate and D131 support was carried out thereon, thereby forming an electron transporting layer 3.

(Formation of Hole Transporting Layer)

Aside from using the K19 dye shown in Formula 41 instead of D131, a hole transporting layer was formed by the same method as in Example 10.

That is, using the same method as in Example 10, a norbornene-based crosslinked copolymer (PTNB) was formed into a film, then irradiated with UV light, thereby forming a hole transporting layer.

This film was then immersed for 1 hour in a saturated acetonitrile solution of the K19 dye shown in Formula 41, following which the film was rinsed for 5 minutes with acetonitrile to remove excess dye.

(Device Fabrication)

Aside from using as the electrolytic solution an aqueous solution containing 0.1 M of methyl viologen, 0.01 M of the compound having the chemical formula in Formula 40, and 0.1 M of LiClO$_4$, a device was fabricated by the same method as in Example 10.

That is, the conductive glass substrate provided with D131-supporting PV10 (substrate on which electron transporting layer 3 was formed) and the conductive glass substrate provided with K19-supporting PTNB (substrate on which the hole transporting layer 4 was formed) were arranged so that the PV10 layer and the PTNB layer faced each other, heat-meltable adhesive was interposed therebetween and, while heating the adhesive, pressure was applied in the thickness direction, thereby bonding together the substrates. In addition, the above-described electrolyte solution was added via injection ports, and the ports were plugged with UV-curable resin.

This process resulted in the fabrication of a photoelectric element.

This process resulted in the fabrication of a photoelectric element.

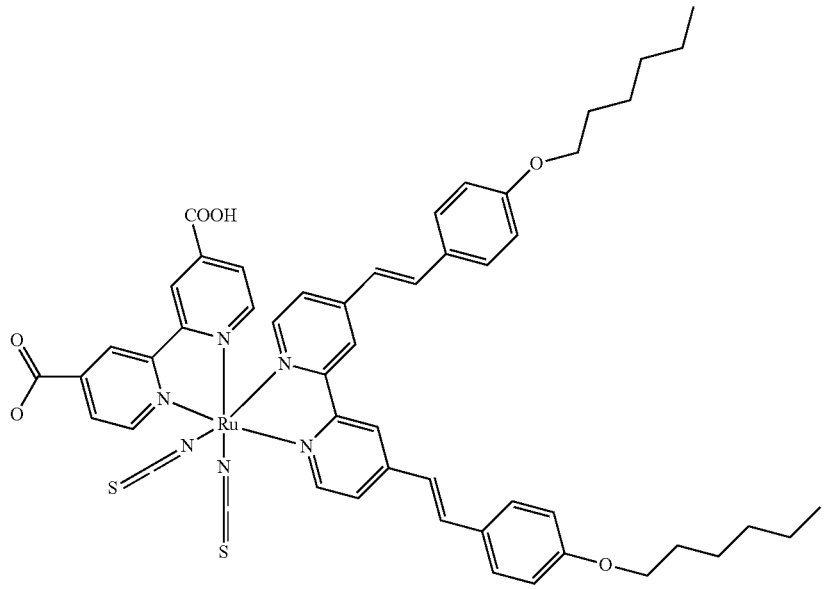

Formula 41

Comparative Example 2

Device Fabrication

A galvi polymer film treated with a saturated solution of D131, like the electron transporting layer in Example 8, was formed.

Next, chloroplatinic acid was dissolved in isopropyl alcohol to a concentration of 5 mM, and the resulting solution was spin-coated onto the coating film of the conductive glass substrate, then fired at 400° C. for 30 minutes, thereby forming an accompanying second electrode 5.

The substrate on which a galvi polymer film had been provided and the second electrode 5 were bonded together by the same method as in Example 10, and electrolyte solution was injected therein. However, the electrolyte solution used in this case was an acetonitrile solution containing 1 M of 2,2,6,6-tetramethylpiperidin-1-oxyl, 2 mM of a sensitizing dye (D131), 0.5 M of LiTFSI, and 1.6 M of N-methylbenzimidazole.

That is, a conductive glass substrate on which a galvi polymer film had been provided and a conductive glass substrate on which a second electrode 5 had been provided were arranged so that the galvi polymer film and the second electrode 5 faced each other, a heat-meltable adhesive was interposed therebetween, and bonding was carried out by applying pressure thereto while heating the adhesive. In addition, the above-described electrolyte solution was added via injection ports, and the ports were plugged with UV-curable resin.

[Evaluation Tests]

The open circuit voltage and short circuit current values of the photoelectric elements obtained in Examples 6 to 11 of the invention and Comparative Example 2 were measured by IV measurement using a Keithley 2400 SourceMeter (model 2400 general-purpose source meter from Keithley Instruments) while irradiating a region of the photoelectric element having a top-view surface area of 1 cm$^2$ with 200 lux light. Measurement was carried out in a 25° C. environment using a fluorescent lamp (rapid fluorescent lamp FLR 20S•W/M, from Panasonic Corporation) as the light source. In addition, the photoelectric element was evaluated under conditions where a photoelectric conversion area of 1 cm$^2$ received light. Those results are shown in Table 2 below.

TABLE 2

|  | Open circuit voltage | Short circuit current |
| --- | --- | --- |
| Example 6 | 850 mV | 1.1 µA/cm$^2$ |
| Example 7 | 840 mV | 1.4 µA/cm$^2$ |
| Example 8 | 800 mV | 1.9 µA/cm$^2$ |
| Example 9 | 800 mV | 1.3 µA/cm$^2$ |
| Example 11 | 650 mV | 3.0 µA/cm$^2$ |
| Example 12 | 690 mV | 2.8 µA/cm$^2$ |
| Comparative Example 2 | 510 mV | 1.0 µA/cm$^2$ |

Here, in the photoelectric elements of Examples 6 to 11, organic compounds were with electrolyte solution to form gel layers 6 and 7; the electrolyte solution was not present in a highly flowable state. On the other hand, in the photoelectric element in Comparative Example 1, the electrolyte solution was present in a state having flowability. It was thus confirmed that, compared with Comparative Example 2, there was little likelihood of fluid leakage arising in the photoelectric elements of Examples 6 to 11.

The above results demonstrated that when gel layers 6 and 7 are composed of the electron transporting layer 3 and the hole transporting layer 4, the photoelectric element does not undergo fluid leakage, has a sufficiently large interface, and achieves an excellent photoelectric conversion efficiency. By using such photoelectric elements, high-output sensitizing dye-type solar cells can be achieved.

EXPLANATION OF REFERENCE NUMERALS

2 First electrode
3 Electron transporting layer
4 Hole transporting layer
5 Second electrode
6 First gel layer
7 Second gel layer

The invention claimed is:

1. A photoelectric element comprising a pair of electrodes, an electron transporting layer and a hole transporting layer which are disposed between the electrodes, and an electrolyte solution,
   wherein the hole transporting layer comprises a first organic compound having a redox moiety capable of repeated oxidation and reduction,
   the electrolyte solution stabilizes a reduced state of the redox moiety, and
   the organic compound and the electrolyte solution together form a first gel layer.

2. The photoelectric element according to claim 1, further comprising a sensitizing dye which is present in the first gel layer.

3. The photoelectric element according to claim 1, wherein the hole transporting layer includes a nitroxide radical polymer.

4. The photoelectric element according to claim 1, wherein the electron transporting layer includes at least one compound selected from the group consisting of viologen derivatives, phenoxyl derivatives and quinone derivatives.

5. The photoelectric element according to claim 2, wherein an open circuit voltage A (V) after 5 minutes of irradiation with 200 lux light and an open circuit voltage B (V) when 5 minutes have elapsed after shielding of the light following irradiation satisfy the following condition:

$$(B/A) \times 100 \geq 10.$$

6. The photoelectric element according to claim 1, wherein the electron transporting layer comprises a second organic compound having a redox moiety capable of repeated oxidation and reduction,
   the second organic compound and the electrolyte solution together form a second gel layer, and
   the electron transporting layer has a higher redox potential than the hole transporting layer.

7. The photoelectric element according to claim 6, further comprising a sensitizing dye which carries out an electron transfer reaction with either or both of the electron transporting layer and the hole transporting layer.

8. The photoelectric element according to claim 1, wherein the first organic compound is swollen with the electrolyte solution to form the first gel layer.

* * * * *